United States Patent [19]
Sakurai et al.

[11] Patent Number: 5,561,393
[45] Date of Patent: Oct. 1, 1996

[54] CONTROL DEVICE OF SEMICONDUCTOR POWER DEVICE

[75] Inventors: Ken'ya Sakurai; Masahito Otsuki; Noriho Terasawa; Tadashi Miyasaka; Akira Nishiura; Masaharu Nishiura, all of Kawasaki, Japan

[73] Assignee: Fuji Electric Co., Ltd., Kanagawa, Japan

[21] Appl. No.: 330,126

[22] Filed: Oct. 27, 1994

Related U.S. Application Data

[60] Continuation-in-part of Ser. No. 245,489, May 18, 1994, abandoned, which is a division of Ser. No. 53,650, Apr. 29, 1993, Pat. No. 5,459,339, which is a continuation-in-part of Ser. No. 14,454, Feb. 2, 1993.

[30] Foreign Application Priority Data

| Feb. 3, 1992 | [JP] | Japan | 4-017575 |
| May 1, 1992 | [JP] | Japan | 4-112763 |
| Aug. 26, 1992 | [JP] | Japan | 4-226793 |
| Oct. 28, 1993 | [JP] | Japan | 5-269355 |

[51] Int. Cl.[6] .......................... H01L 29/74; H03K 17/72
[52] U.S. Cl. .......................... 327/442; 327/441; 327/419; 327/438; 327/582; 327/365; 257/167
[58] Field of Search ........................ 327/83, 376, 377, 327/387, 388, 389, 408, 427, 428, 429, 438, 439, 442, 440, 441, 582, 365; 257/167, 630, 133

[56] References Cited

U.S. PATENT DOCUMENTS

| 4,162,413 | 7/1979 | Akamatsu | 327/442 |
| 4,792,838 | 12/1988 | Hayashi et al. | 327/421 |
| 4,833,587 | 5/1989 | Sugayama et al. | 327/467 |
| 5,132,767 | 7/1992 | Ogura et al. | 357/38 |
| 5,397,905 | 3/1995 | Otsuki et al. | 257/133 |

FOREIGN PATENT DOCUMENTS

| 0463325A3 | 1/1992 | European Pat. Off. . |
| 0568353A1 | 11/1993 | European Pat. Off. . |

*Primary Examiner*—Timothy P. Callahan
*Assistant Examiner*—Dinh T. Le
*Attorney, Agent, or Firm*—Spencer & Frank

[57] ABSTRACT

A control device for controlling a double gate semiconductor device having a second gate electrode for controlling transition from a thyristor operation to a transistor operation, and a first gate electrode for controlling transition from transistor operation to an ON/OFF operation, and for controlling a current passing from a collector electrode to an emitter electrode, includes a first gate control circuit for delaying a turn-off signal to the double gate semiconductor device and applying the turn-off signal to the first gate electrode.

26 Claims, 32 Drawing Sheets

CONTROL DEVICE OF SEMICONDUCTOR POWER DEVICE

The present application is a continuation in part application of U.S. application Ser. No. 08/245,489, filed on May 18, 1994, (now abandoned), which is a division of application Ser. No. 08/053,650, filed Apr. 29, 1993, and now issued, U.S. Pat. No. 5,459,339 which is a continuation in part of Ser. No. 08/014,454, filed Feb. 2, 1993.

BACKGROUND OF THE INVENTION

1. Field of the Invention

The present invention relates to a control device of a semiconductor power device. The semiconductor power device which the control device of the present invention is to control is selectable for thyristor operation or transistor operation as an IGBT(Insulated Gate Bipolar Transistor), specifically having two gate electrodes, and the control device makes the semiconductor power device having two gate electrodes operable by a single signal.

2. Description of the Related Applications

The control device according to the present invention is for controlling two double gate semiconductor devices that have filed by the same inventors.

First Double Gate Semiconductor Device

A first double gate semiconductor device is disclosed in U.S. patent application Ser. No. 08/053,650 filed on Apr. 29, 1993, and now issued, U.S. Pat. No. 5,459,339. The Parent Application of the present application is U.S. application Ser. No. 08/245,489, and now abandoned which is a divisional application of the 08/053,650 Application. Therefore, a description of the structures and functions of the first double gate semiconductor device is incorporated in the present specification by reference, and the description is omitted.

A problem with the first double gate semiconductor device when used in inverters or the like is that the control terminals have to be individually driven. That is, whereas a prior art power device has only a single control terminal connecting the gate electrode, and the power device can be controlled only by supplying a signal to drive the control terminal, in the double gate semiconductor device, two signals meeting the two control terminals connecting to the two gate electrodes have to be prepared. Furthermore, unless the two control signals are appropriately controlled, since the first device does not positively transfer from the thyristor condition to the transistor condition, nor can it be turned off, for inverters and the like, this tends to cause generation of an arm short-circuit.

Furthermore, since the first double gate semiconductor device cannot be turned off unless it is transferred from the thyristor condition to the transistor condition, even when trouble occurs at the initial state where the first device becomes conductive, it is necessary to first transfer the first device to the thyristor condition, and there is the possibility of the occurrence of unrestorable damage during the transition. Furthermore, since, even if trouble occurs during operation, immediate shut-down is difficult, it is necessary to find the trouble during operation as early as possible and take measures to transfer to the transistor condition.

Therefore, it is first object of the present invention to provide a control device applied to a double gate semiconductor device having advantageous characteristics such as high speed and reduced power, which is possible to be handled as conventional power devices and protect the double gate semiconductor device from troubles such as an abnormal current and the like. Second Double Gate Semiconductor Device FIG. 1 is a cross sectional illustration of a second double gate semiconductor device which is controlled by the control device of the present invention. This semiconductor device is disclosed in detail in U.S. patent application Ser. No. 08/218200, filed on Mar. 28, 1994, which is a Continuation Application of U.S. patent application Ser. No. 08/096978, filed Jul. 27, 1993. The second double gate semiconductor device will be described briefly below.

As shown in the Figure, the second double gate semiconductor device 15 comprises a $p^+$ type semiconductor substrate as a collector layer 2 provided on the surface with a collector electrode 1, and an $n^-$ type base layer 3 epitaxially formed on top of the collector layer 2. A p type well-formed base layer 4 is diffused on the surface of the $n^-$ type base layer 3. Further, an $n^+$ type well-formed first emitter layer 5a, a second emitter layer 5b, and a drain layer 6, independent of each other, are formed on the inner surface of the p type base layer 4. Of these components, the $n^+$ type emitter layers 5a and 5b are connected to each other through emitter electrodes 7a and 7b, and the p type base layer 4 and the $n^+$ type drain 6 are connected with a short-circuit electrode 8 extending thereover. From the $n^+$ type emitter layer (first emitter layer) 5a to the surface of the p type base layer 4 and the $n^-$ type base layer 3, a polycrystalline first gate electrode 10 forming a first MOSFET 12 is provided through a gate oxide film 9. On the other hand, from the $n^+$ drain layer 6 to the surface of the p type base layer 4 and the $n^+$ emitter layer (second emitter layer) 5b, a polycrystalline second gate electrode 11 forming a second MOSFET 13 is provided through the gate oxide film 9. The first MOSFET 12 formed of the first gate electrode 10 and the second MOSFET 13 formed of the second gate electrode 11 are both n channel type MOSFETs.

FIG. 2 is an equivalent circuit diagram of the second double gate semiconductor device shown in FIG. 1. As shown, an npn type transistor Qnpn 1 is formed of the $n^+$ type first emitter layer 5a, the p type base layer 4, and the $n^-$ type base layer 3, and an npn type transistor Qnpn 2 is formed of the $n^+$ type second emitter layer 5b, the p type base layer 4, and the $n^-$ type base layer 3. Further, a pnp type transistor Qpnp is formed of the p type base layer 4, the $n^-$ type base layer 3, and the $p^+$ type collector layer 2. Therefore, a thyristor structure is formed of the parallel connected transistors Qnpn 1, Qnpn 2, and Qpnp with separate emitter layers. To these transistors Qnpn 1, Qnpn 2, and Qpnp, the first MOSFET 12 serves a function to connect the $n^-$ type base layer 3 as the collector of the transistor Qnpn 1 with the first emitter layer 5a to inject electrons to the n type base layer 3 through the p type base layer 4. Further, the second MOSFET 13 serves a function to connect the drain layer 6 and the second emitter layer 5b to accept positive holes from the base layer 4.

FIG. 3 is a timing chart showing an ON/OFF control method of the second double gate semiconductor device shown in FIG. 1. As shown, when the first gate electrode 10 is maintained at a zero potential (L level) and the second gate electrode 11 at a high potential (H level), the second double gate semiconductor 15 goes to a turn-off condition, where the transistors Qnpn 1, Qnpn 2, and Qpnp are all nonconductive to block current from the collector electrode 1 to the emitter electrodes 7a and 7b. As a control method to turn on the second double gate semiconductor device 15 in the turn-off condition, first, when a high potential is applied to the first gate electrode 10, a transistor condition is achieved where only the transistor Qpnp becomes conductive and, with this condition, when a zero potential is applied to the second gate electrode 11, a thyristor condition is achieved where all of the transistors Qnpn 1, Qnpn 2, and Qpnp are conductive, and a current Ic is passed through to provide a low turn-on resistance of less than 1 V. Then, to turn off the second double gate semiconductor device 15, first, a high potential is applied to the second gate electrode 11 to set the transistor condition where the transistors Qnpn 1 and Qnpn 2 are non-conductive and, with this condition, a low potential is applied to the first gate electrode 10 to make the transistor Qpnp non-conductive, thereby setting the second double gate semiconductor device 15 in the turn-off condition and block the current Ic.

Turn-off control of the second double gate semiconductor device 15 of the above construction is similar to that of a prior art double gate semiconductor device (not shown) wherein the transistor condition is achieved as a stand-by condition, however, whereas the first gate electrode 10 sets a turn-on signal at a rising edge of the gate signal and a turn-off signal at a falling edge to achieve ON/OFF control, the second gate electrode 11 must make a transition control from the thyristor operation to the transistor operation using the falling edge of the gate signal as a turn-on (transition) signal from the transistor condition to the thyristor condition, and the rising edge as a turn-off (transition) signal from the thyristor operation to the transistor operation. Thus, the ON/OFF control method differs from that of the prior art semiconductor device in that the voltage application modes of the two gate electrode potentials are reverse to each other. Therefore, a control device to control the second double gate semiconductor device 15 is required to be able to produce two control signals with operation modes reverse to each other from a signal input gate signal (input signal) while maintaining the mutual timing, which are supplied to the first and second gate electrodes. In particular, since, unless the two control signals are appropriately controlled, transfer from the thyristor condition to the transistor condition is not positively achieved, resulting in an unstable turn-off operation, when the second double gate semiconductor device is used as a switching device in an inverter, this results in an arm short-circuit, leading to a major accident.

Further, the double gate semiconductor device cannot make turn-off control of the current not via the transistor condition, and must be transferred first to the transistor condition when a trouble occurs immediately after turning on, difficult to be immediately shut off, and is thus required to have a protective function for early detection of a trouble during operation. In particular, the second double gate semiconductor device 15 has a property that it is not allowed to achieve the turn-off condition, when the first gate electrode is set to a low potential, that is, an L level voltage lower than the gate ON threshold level, the thyristor condition when the first gate electrode is set to a high potential and the second gate electrode to a low potential, the transistor condition when both the first gate electrode and the second gate electrode are set to a high potential, the first gate electrode and the second gate electrode not allowed both to go a low potential, and it is destroyed when an operating voltage is applied across the collector and the emitter with the first gate electrode and the second electrode both at a low potential, and it is required to find such an abnormal condition at an early time to effect a protective operation.

Therefore, a second object of the present invention is to provide a control device for a double gate semiconductor device, which allows a pair of gate electrodes having voltage application modes reverse to each other to be operable by a single input signal, and has a protective function for an abnormal condition.

SUMMARY OF THE INVENTION

In the present invention, in order to solve the foregoing problems in a control device for controlling a double gate semiconductor device, first, delay means is used to make the first double gate semiconductor device possible to be turned off by a single turn-off signal. Specifically, in accordance with the present invention, there is provided a control device for controlling a double gate semiconductor device having a second gate electrode capable of controlling the transition from a thyristor operation to a transistor operation, and a first gate electrode capable of controlling the transition from the transistor operation to an ON/OFF operation, and capable of controlling a passing current from a collector electrode to an emitter electrode, the control device comprises first gate control means for delaying a turn-off signal to the first double gate semiconductor device and applying the turn-off signal to the first gate electrode.

As first gate control means, it is effective to use timer delay means for applying a delayed turn-off signal to the first electrode for a predetermined time. It is also effective to use operation determination delay means comprising an operation determination circuit unit for determining an operating voltage applied to the collector electrode and a turn-off signal application circuit unit for applying a turn-off signal to the first gate electrode according to the determination result of the operation determination circuit unit.

Furthermore, to prevent a trouble due to an abnormality at turning on the first double gate semiconductor device, it is preferable to use second gate control means for applying a delayed turn-on signal to the second gate electrode. As the second gate control means, it is effective to use abnormality detection delay means comprising a current determination circuit unit capable of determining a passing current, a turn-on signal application circuit unit for applying a turn-on signal to the second gate electrode according to the determination result of the current determination circuit unit, and a turn-off signal application circuit unit for applying a turn-off signal to the first gate electrode according to the determination result of the current determination circuit unit. As the current determination circuit unit, it is also possible to use a voltage determination circuit unit capable of determining an operating voltage applied to the collector electrode to determine the current value.

To protect the first double gate semiconductor device in operation, it is effective to provide passing current determination means capable of determining a passing current value and turn-off signal output means capable of outputting a turn-off signal according to the determination result of the passing current determination means.

Further, the device comprises first gate control means and second gate control means, and the second gate control means may be abnormality detection delay means having a turn-off signal application circuit unit for applying a turn-off signal to the first gate control means according to the determination result of the current determination circuit unit.

When the first gate control means is timer delay means for delaying the turn-off signal for a predetermined time and applying it to the first gate, it is desirable to connect the timer delay means in series with first and second time constant determination units, and it is effective to input a turn-off signal from the turn-off signal application circuit unit to the second time constant determination unit. The first time constant determination unit and the second time constant determination unit can be first and second resistor means constituting the timer delay means, or first and second capacitors.

It is also desirable to provide rectification means allowing current to pass only in a direction from the second gate electrode to the first gate electrode and, in this case, it is effective that the first gate electrode, the second gate electrode, and the rectification means are formed of polycrystalline silicon formed on the surface of the first double gate semiconductor device. When the first gate electrode is of an $n^-$ type and the second gate electrode is of a $p^-$ type, the $n^-$ type portion of the rectification means having a pn junction may be connected to the first gate electrode, and the $p^-$ type portion may be connected to the second gate electrode. Also, it is effective to connect the $n^-$ type portion of the rectification means to the first gate electrode by aluminum deposition wiring, and the $p^-$ type portion to the second gate electrode by aluminum deposition wiring.

In the control device of the above arrangement, when a turn-off signal to the first double gate semiconductor device is delayed by the first gate control means capable delaying a turn-off signal and applied to the first gate electrode, after the first double gate semiconductor device is transferred to the transistor condition by a turn-off signal applied to the second gate electrode, the first gate electrode can be applied with a turn-off signal, and it is possible to positively turn off the first double gate semiconductor device. Therefore, it is possible to control the first double gate semiconductor device by a single turn-off signal, and it is sufficient that an external device using the first double gate semiconductor device may have a single control signal as in the prior art. When timer delay means is used as the first gate control means, the transistor condition can be turned off after a predetermined time for the transition from the thyristor condition to the transistor condition. It is also possible to determine the transition from the thyristor condition to the transistor condition according to an operating voltage applied to the collector electrode using the operation determination circuit unit. Therefore, after the transition to the transistor condition is confirmed using the turn-off signal application circuit unit, the transition from the transistor condition to a turn-off condition can also be positively achieved by applying a turn-off signal to the first gate electrode.

When the second gate control means which is capable of delaying the turn-on signal is used, first a turn-on signal can be applied to the first gate electrode to turn on the first double gate semiconductor device from the transistor condition. Therefore, when there is an abnormality during an ON state, a turn-off signal can be applied to the first gate electrode to immediately turn off the first double gate semiconductor device. When the first double gate semiconductor device normally operates in the transistor condition, a turn-on signal can be applied from the second gate control means to the second gate electrode to transfer the device to the thyristor condition. As such second gate control means, an overcurrent in the transistor condition is detected by the current determination circuit unit, when it is an overcurrent, no turn-on signal is applied from the turn-on signal application circuit to the second gate electrode, but on the contrary, a turn-off signal is applied from the turn-off signal application circuit unit to the first gate electrode to set the first double gate semiconductor device to an OFF state, thereby preventing the first double gate semiconductor device from a trouble such as burning.

Furthermore, a passing current of the first double gate semiconductor device is monitored by the passing current determination means, and a turn-off signal can be outputted depending on the value of passing current to protect the first double gate semiconductor device earlier than other protective circuits. The turn-off signal can be a single signal when the first gate control means is used and, as the passing current determination means, it is possible to use a circuit for detecting the passing current, a circuit for determining from the operating current, or the like.

In the timer delay means of the first gate control means, the delay time of turn-off signal generation during occurrence of an abnormality is reduced by connecting the first and second time constant determination units in series and inputting a turn-off signal to the second time constant determination unit. Therefore, when an abnormality occurs, it is possible to reduce the time from the transistor condition to turning off to prevent the first double gate semiconductor device from being damaged.

Furthermore, when the rectification means is provided, occurrence of an inhibited mode such that the potential of the second gate electrode is higher than the first gate electrode can be prevented in any cases. Therefore, the first double gate semiconductor device can be prevented from being latched up uncontrollably.

In accordance with the present invention, which solves the above problems about to the second double gate semiconductor device, there is provided a control device for a double gate semiconductor device having a second gate electrode capable of controlling transition to a thyristor condition and a transistor condition, and a first gate electrode capable of controlling transition from the transistor condition to an ON/OFF operation, for controlling the first gate electrode and the second gate electrode of the second double gate semiconductor device having voltage application modes to both the gate electrodes reverse to each other according to a single input signal, characterized by comprising: first gate electrode control means for delaying a turn-off signal of the input signal and supplying the delayed signal to the first gate electrode; and second gate electrode control means for reversing the input signal and supplying the reversed signal to the second gate electrode.

The first gate control means has timer delay means for delaying a turn-off signal of the input signal for a predetermined time and applying the signal to the first gate electrode, and the second gate electrode control means has a reversing inverter for the input signal and an even number of waveform shaping inverters connected in series to the inverter.

The first gate control means has operation determination delaying means comprising an operation determination circuit for determining an operating voltage applied to a collector electrode of the second double gate semiconductor device, and a turn-off signal applying circuit for applying a turn-off signal to the first gate electrode according to the determination result of the operation determination circuit, and the second gate electrode control means comprises a reversing inverter of the input signal and an even number of waveform shaping inverters connected in series to the reversing inverter.

There is also provided according to the present invention another version of control device for a double gate semiconductor device having a second gate electrode capable of controlling transition to a thyristor condition and a transistor condition, and a first gate electrode capable of controlling transition from the transistor condition to an ON/OFF operation, for controlling the first gate electrode and the second gate electrode of the second double gate semiconductor device having voltage application modes to both the gate electrodes reverse to each other according to a single input signal, characterized by comprising: first gate electrode control means having timer delay means for delaying a turn-off signal of an input signal for a predetermined period of time and applying the signal to the first gate electrode; second gate electrode control means comprising a reversing inverter of the input signal and an even number of waveform shaping inverters connected in series to the reversing inverter; and abnormality detection and protective means comprising a passing current determination circuit capable of determining an abnormality of a passing current value, and a turn-off signal applying circuit for applying a turn-off signal to the first gate electrode control means in response to the abnormality determination result of the passing current determination circuit.

There is further provided according to the present invention another version of control device for a double gate semiconductor device having a second gate electrode capable of controlling transition to a thyristor condition and a transistor condition, and a first gate electrode capable of controlling transition from the transistor condition to an ON/OFF operation, for controlling the first gate electrode and the second gate electrode of the second double gate semiconductor device having voltage application modes to both the gate electrodes reverse to each other according to a single input signal, characterized by comprising: first gate electrode control means for delaying a turn-off signal of the input signal and supplying the signal to the first gate electrode; and second gate electrode control means for delaying the input signal, reversing the potential in response to the abnormality determination result of the passing current value, and applying the potential to the second gate electrode.

The second gate electrode control means comprises a current determination circuit capable of determining an abnormality of a passing current value, a reversed turn-on signal applying circuit for outputting a turn-on signal delayed in response to the determination result of the current determination circuit, reversing the delayed turn-on signal and applying turn-on signal to the second gate electrode, and a turn-off signal applying circuit for applying a turn-off signal to the first gate electrode according to the abnormality determination result of the current determination circuit.

The second double gate semiconductor device is a sense double gate semiconductor device having a sense terminal, and the current determination circuit capable of determining an abnormality of the passing current is connected to the sense terminal.

The current determination circuit of the second gate electrode control means is a voltage determination circuit capable of determining an abnormality of the operating voltage applied to the collector electrode of the second double gate semiconductor device.

The second gate electrode control means has abnormality detection means comprising a passing current determination circuit capable of determining an abnormality of the passing current value, a turn-on signal applying circuit for applying a turn-on signal delayed according to the abnormality determination result of the passing current determination circuit to the second gate electrode through a reversing inverter, and a turn-off signal applying circuit for applying a turn-off signal to the first gate electrode according to the abnormality determination result of the passing current determination circuit.

There is further provided according to the present invention another version of control device for a double gate semiconductor device having a second gate electrode capable of controlling transition to a thyristor condition and a transistor condition, and a first gate electrode capable of controlling transition from the transistor condition to an ON/OFF operation, for controlling the first gate electrode and the second gate electrode of the second double gate semiconductor device having voltage application modes to both the gate electrodes reverse to each other according to a single input signal, characterized by comprising: first gate electrode control means having timer delay means for delaying a turn-off signal of an input signal for a predetermined period of time and applying the turn-off signal to the first gate electrode; second gate electrode control means having timer delay means for delaying a turn-on signal of the input signal for a predetermined period of time and a reversing inverter for converting the delayed turn-on signal to a turn-off signal and supplying the turn-off signal to the second gate electrode; and abnormality detection and protective means comprising a timer circuit for detecting a rising edge of an operating voltage applied to a collector electrode of the double gate semiconductor device to operate for a predetermined time, an abnormality notify circuit for monitoring the first gate electrode potential and the second gate electrode potential during operation of the timer circuit and giving a low-potential notify signal when both the gate electrode potentials are low, and a turn-off signal applying circuit for applying a turn-off signal to the first gate electrode control means and the second gate electrode control means in response to the notify signal.

With the inventive control device for controlling the second double gate semiconductor device, which comprises first gate electrode control means for supplying a turn-off signal of an input signal to the first gate electrode, and second gate electrode control means for reversing the input signal and applying the reversed signal to the second gate electrode, the following effect is obtained. First, with no input signal, the first gate electrode control means sets the first gate electrode to a low potential, and the second electrode control means sets the second gate electrode to a high potential. Further, at a rising edge of the input signal, the first gate electrode goes to a high potential, and the second gate electrode goes to a low potential for transition to the thyristor condition. At a falling edge of the input signal, the first gate electrode remains maintained at the high potential by the delaying function of the first gate electrode control means, and the second gate electrode changes to the high potential for transition to the transistor condition. At the end of the delaying function of the first gate electrode control means, the first gate electrode goes to the low potential to obtain a function to block the passing current. As a result, since the second double gate semiconductor device with voltage application modes of the pair of gate electrodes reverse to each other can be controlled by a single input signal, a single control signal is sufficient to control an external device using the second double gate semiconductor device such as a switching power supply device as in the case of using a prior art single gate semiconductor device.

Further, when the timer delay means for delaying the falling edge of the input signal (turn-off signal) for a predetermined time is used as the first gate electrode control means, a function to maintain the transistor condition for a period corresponding to the delay time to assure the turn-off operation is obtained. Therefore, by using the input signal reversing inverter and the even number of waveform shaping inverters connected in series to the inverter to form the second gate electrode control means, a function to reverse and shape the input signal to assure transition to the thyristor condition and the transistor condition, and produce a gate voltage adapted to the pair of gate electrodes reverse in operation mode to each other. Further, when the first gate electrode control means is formed of the operation determination delay means, since transition from the thyristor condition to the transistor condition can be determined from a change in the operating voltage to apply the turn-off signal to the first gate electrode, the second double gate semiconductor device can be positively controlled from the transistor condition to the turn-off condition.

Further, when the above control device is provided with the abnormality detection and protective means comprising the passing current determination circuit and the turn-off signal applying circuit, if an overcurrent flows during operation of the second double gate semiconductor device, it is detected by the passing current determination circuit, a turn-off signal is applied to the first and second gate electrodes through the turn-off signal applying circuit to set the second double gate semiconductor device to the turn-off condition, and a function to avoid an abnormal condition and protect the second double gate semiconductor device from being damaged can be obtained.

When the control device is formed of the first gate electrode control means for delaying the turn-off signal of input signal and supplying the signal to the first gate electrode, and the second gate electrode control means for delaying the input signal and reversing its potential and applying the potential to the second gate electrode, a function to positively and flexibly select ON/OFF control of the second double gate semiconductor device starting from the transistor condition, such that the falling edge of the second gate electrode potential, during the delaying period, the first gate electrode potential rises to transfer the second double gate semiconductor device from OFF state to the transistor condition and, after the delaying period, the second gate electrode potential falls to transfer the second double gate semiconductor device to the thyristor condition.

Further, when the second gate electrode control means is provided with the current determination circuit capable of determining an abnormality of the passing current value, and the turn-off signal applying circuit for applying OFF signal to the first gate electrode according to the abnormality determination result, a function to prevent damages to the semiconductor device due to an overcurrent, since it is possible that the current determination circuit detects an overcurrent in the transistor condition, the turn-off signal applying circuit applies the turn-off signal to the first gage electrode to immediately turn off the second double gate semiconductor device.

Further, when the second double gate semiconductor device is a sense double gate semiconductor device with a sense terminal, by connecting a current determination circuit capable of determining an abnormality of the passing current to the sense terminal, a function to reduce the current in the detection resistor of the current determination circuit and facilitate the detection. Moreover, a similar function can be obtained by replacing the current determination circuit with a voltage determination circuit capable of determining an abnormality of the operating voltage applied to the collector electrode of the second double gate semiconductor device.

Further, when the second gate electrode control means is provided with abnormality detection means comprising a passing current determination circuit capable of determining an abnormality of the passing current value, a turn-on signal applying circuit for applying a delayed turn-on signal to the second gate electrode through the reversing inverter according to the abnormality determination result of the passing current determination circuit, and a turn-off signal applying circuit for applying a turn-off signal to the first gate electrode control means according to the abnormality determination result of the passing current determination circuit, a protective function can be obtained which, even when an abnormality occurs in either the transistor condition or the thyristor condition, a turn-on signal is immediately applied from the turn-on signal applying circuit to the second gate electrode to set the second double gate semiconductor device to the transistor condition, thereby enabling safe turn-off operation.

Next, when the control device having the first gate electrode control means having timer delay means, and second gate electrode control means having timer delay means and a reversing inverter, is provided with abnormality detection and protective means comprising a timer circuit for detecting a rising edge of the operating current to operate for a predetermined time, an abnormality notify circuit for monitoring the first gate electrode potential and the second gate electrode potential during operation of the timer circuit and, when the gate electrode potentials are both low, giving a low-potential notify signal, and a turn-off signal applying circuit for applying a turn-off signal to the first and second gate electrode control means in response to the notify signal, the abnormality notify circuit monitors the first and second gate electrode potentials for the period when the timer circuit operates for a predetermined time and interrupts the application of the operating voltage to the collector, when the gate electrode potentials are both low, a low-potential notify signal is given, and the turn-off signal applying circuit operates in response to the low-potential notify signal to apply a turn-off signal to the first gate electrode control means and the second gate electrode control means, thereby maintaining the second double gate semiconductor device in OFF state. Therefore, when an external device receiving the notify signal is adapted to discontinue supply of the operating voltage to the collector electrode, application of the operating voltage across the collector and the emitter can be prevented in the condition where both the first and second gate electrodes are at a low potential, thereby preventing occurrence of latch-up in the second double gate semiconductor device and damages due to the latch-up.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Embodiment 1

Figure 1:
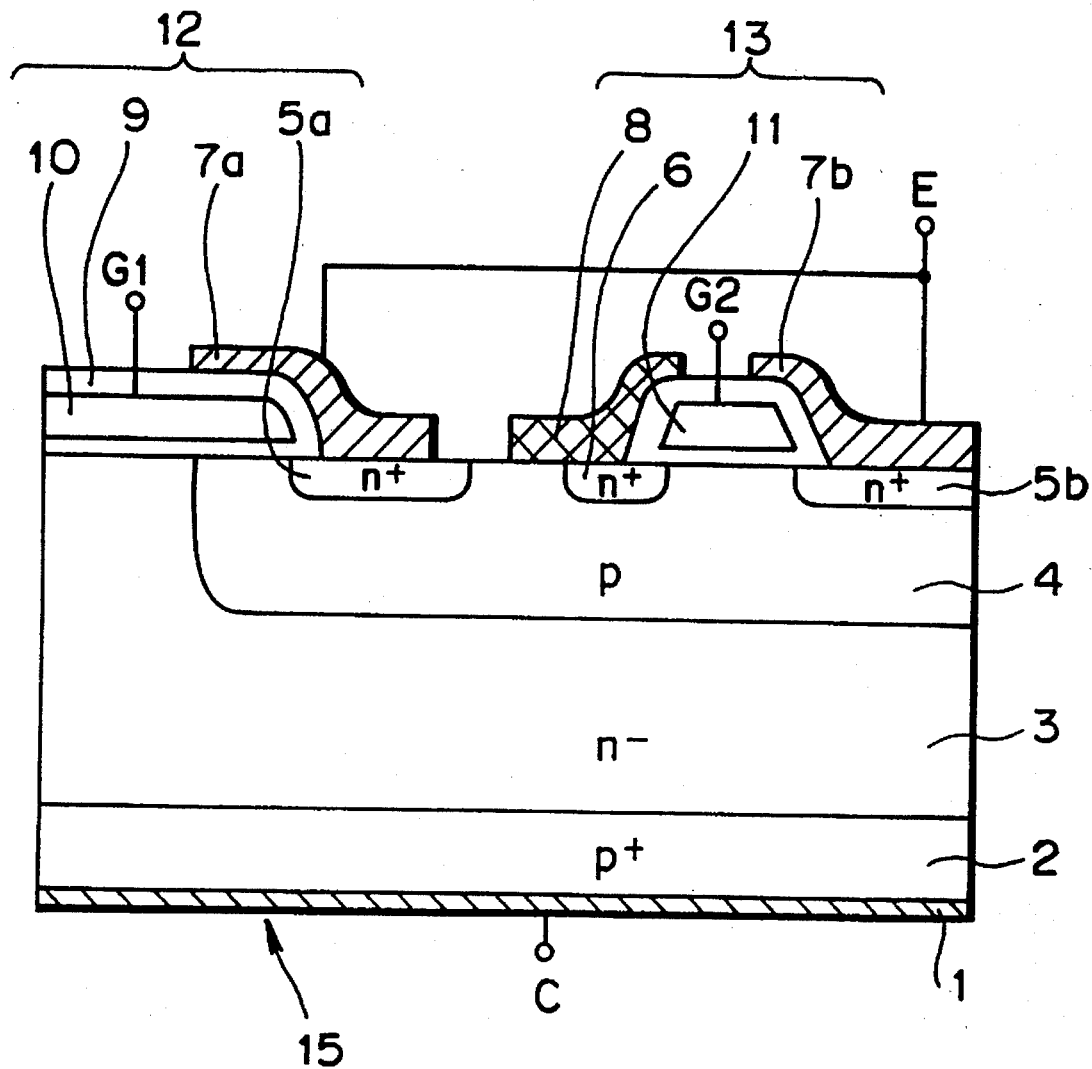
FIG. 1 is a schematic illustration showing the structure of the second double gate semiconductor device to be controlled by the present invention.
Figure 2:
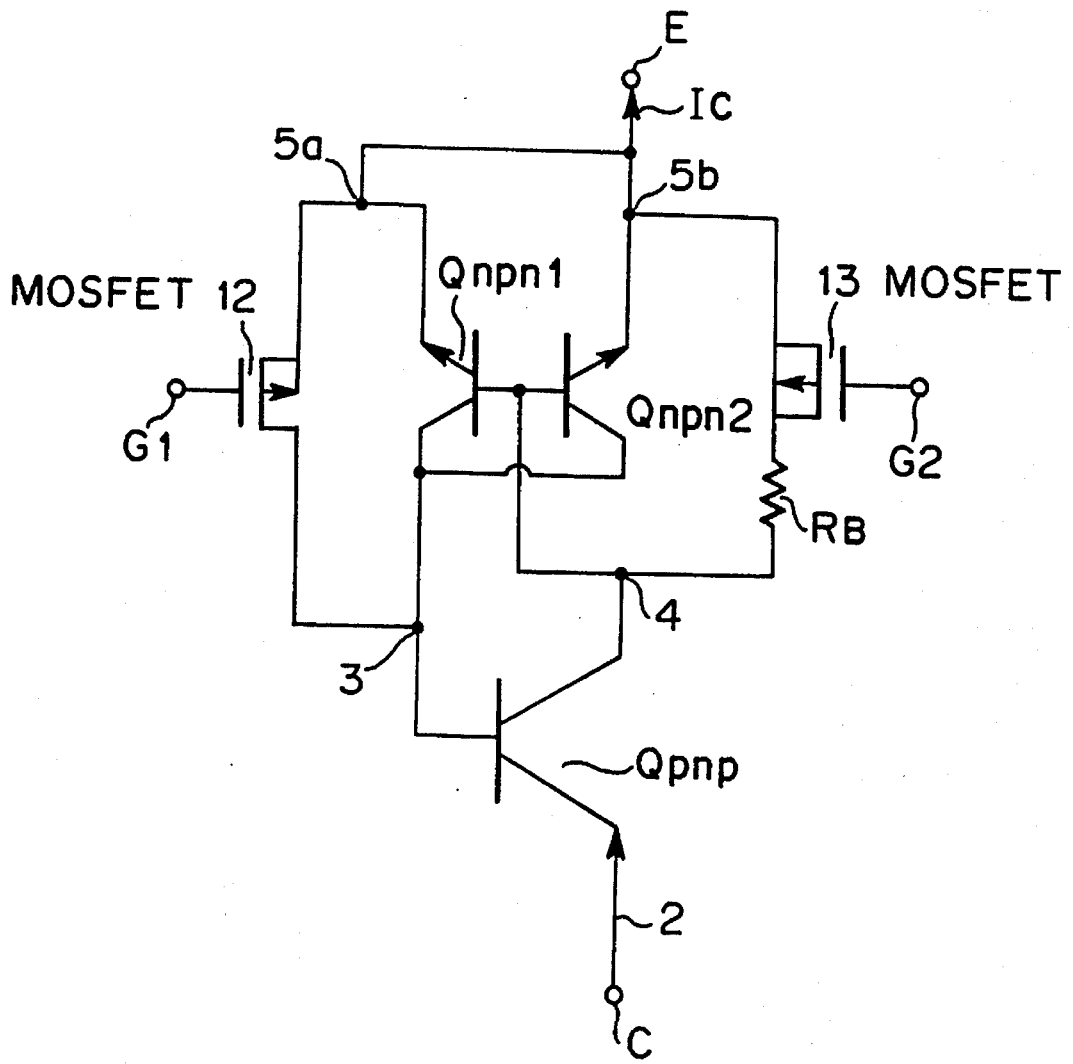
FIG. 2 is an equivalent circuit diagram showing the second double gate semiconductor device shown in FIG. 1.
Figure 3:
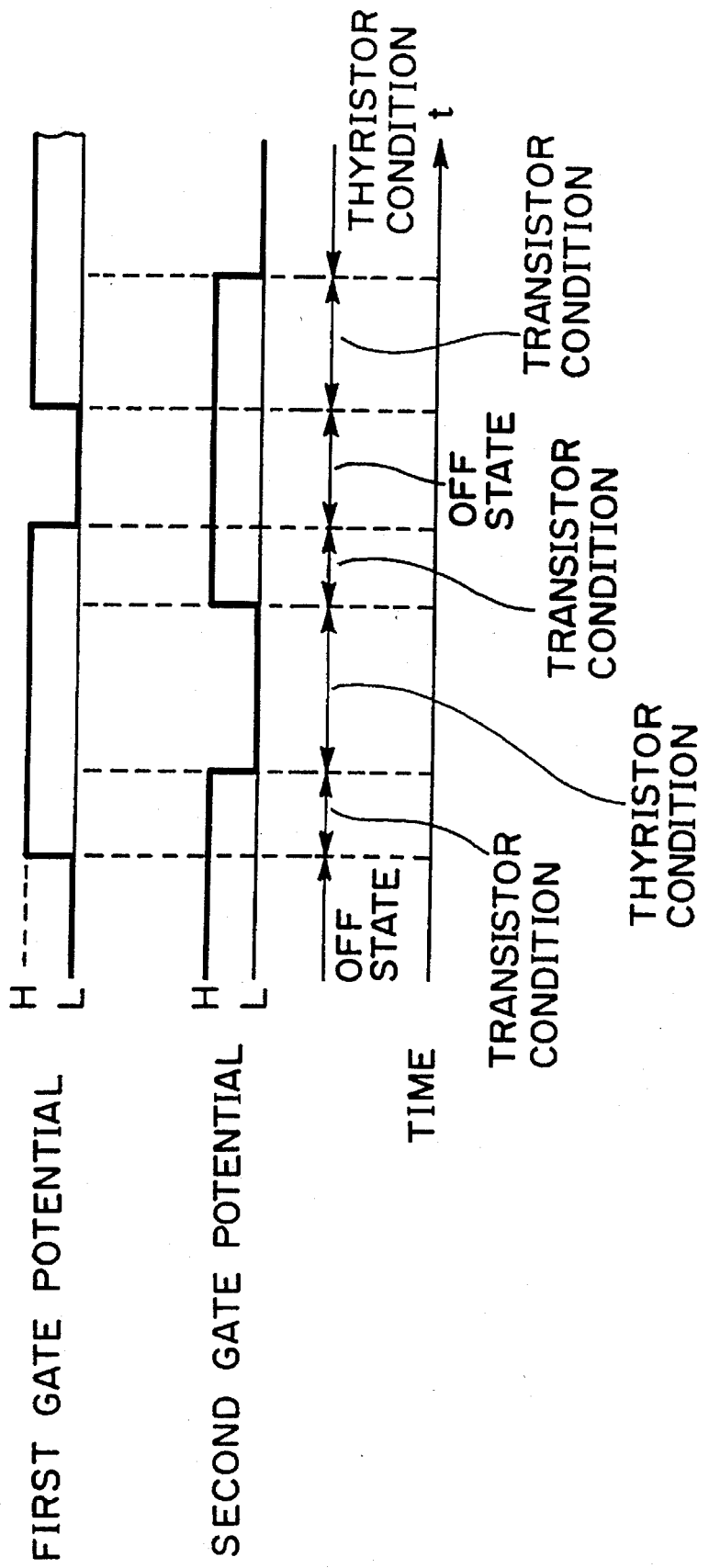
FIG. 3 is a timing chart illustrating an ON/OFF control method of the second double gate semiconductor device shown in FIG. 1.
Figure 4:
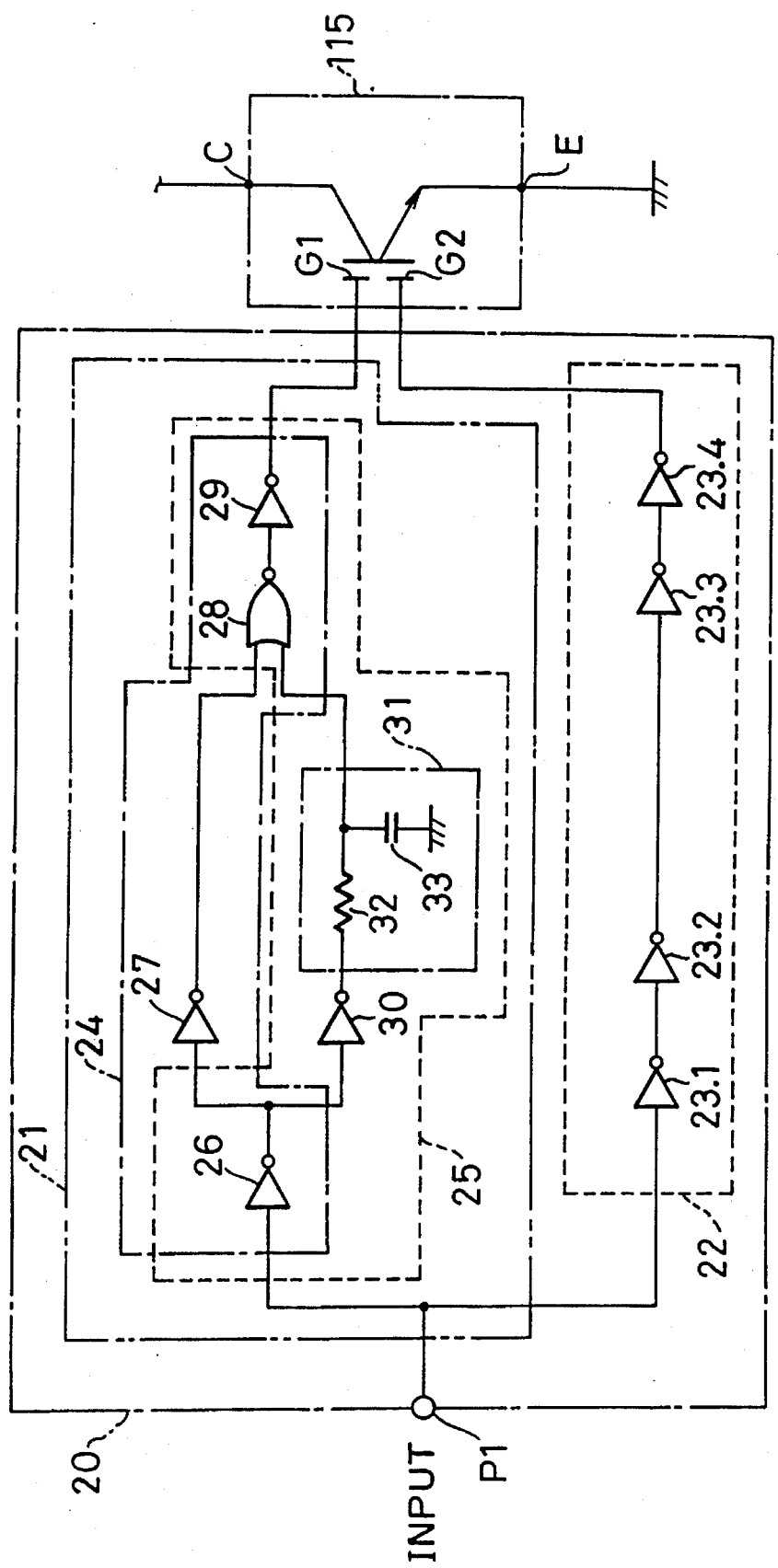
FIG. 4 is a circuit diagram showing the structure of a control device according to an embodiment 1 of the present invention.

FIG. 4 shows the structure of a control device according to an embodiment 1 of the present invention. A control device 20 of the present embodiment is a control device for driving the first double gate semiconductor device 115 having a first gate G1 and a second gate G2. The device 20 comprises a first gate control circuit 21 for applying a control signal inputted to an input terminal P1 to the gate G1, and a second gate control circuit 22 for applying a control signal inputted to the same input terminal P1 to the gate G2. First, in the second gate control circuit 22, four inverters 23.1–23.4 are connected in series, and an input signal is inverted, shaped, and then applied to the gate G2 of the first double gate semiconductor device 115. Therefore, an intermediate potential time where the gate potential is unstable is reduced, thereby preventing a mis-operation.

On the other hand, the first gate control circuit 21 comprises two paths, that is, an ON path 24 and an OFF delay path 25. The ON path 24 comprises an inverter 26 used in combination with the OFF delay path 25, an inverter 27 connected in series with the inverter 26, a NOR gate 28 inputted with a signal from the inverter 27 and a signal from a delay circuit 31 of the OFF delay path 25, and an inverter 29 used in combination with the OFF delay path 25. The OFF delay path 25 comprises the inverter 26, an inverter 30 connected in series with the inverter 26, the delay circuit 31 including a resistor 32 and a capacitor 33, the NOR gate 28, and the inverter 29. Therefore, when a high-level turn-on signal is inputted to the input terminal P1, the turn-on signal, after delaying by the inverters 26, 27, and 28, and the NOR gate 28, is applied to the gate G1. On the other hand, when a low-level turn-off signal is inputted, in addition to the above delay, the turn-off signal, after charging the delay circuit 31, is applied to the gate G1. Therefore, the first gate control circuit 21 is a control circuit in which only the turn-off signal is delayed by the time of the timer circuit 31 and applied to the gate G1. The inverters 26 and 30 also have a function for shaping the waveform of the input signal to suppress errors in delay time of the timer circuit 31.

Figure 5:
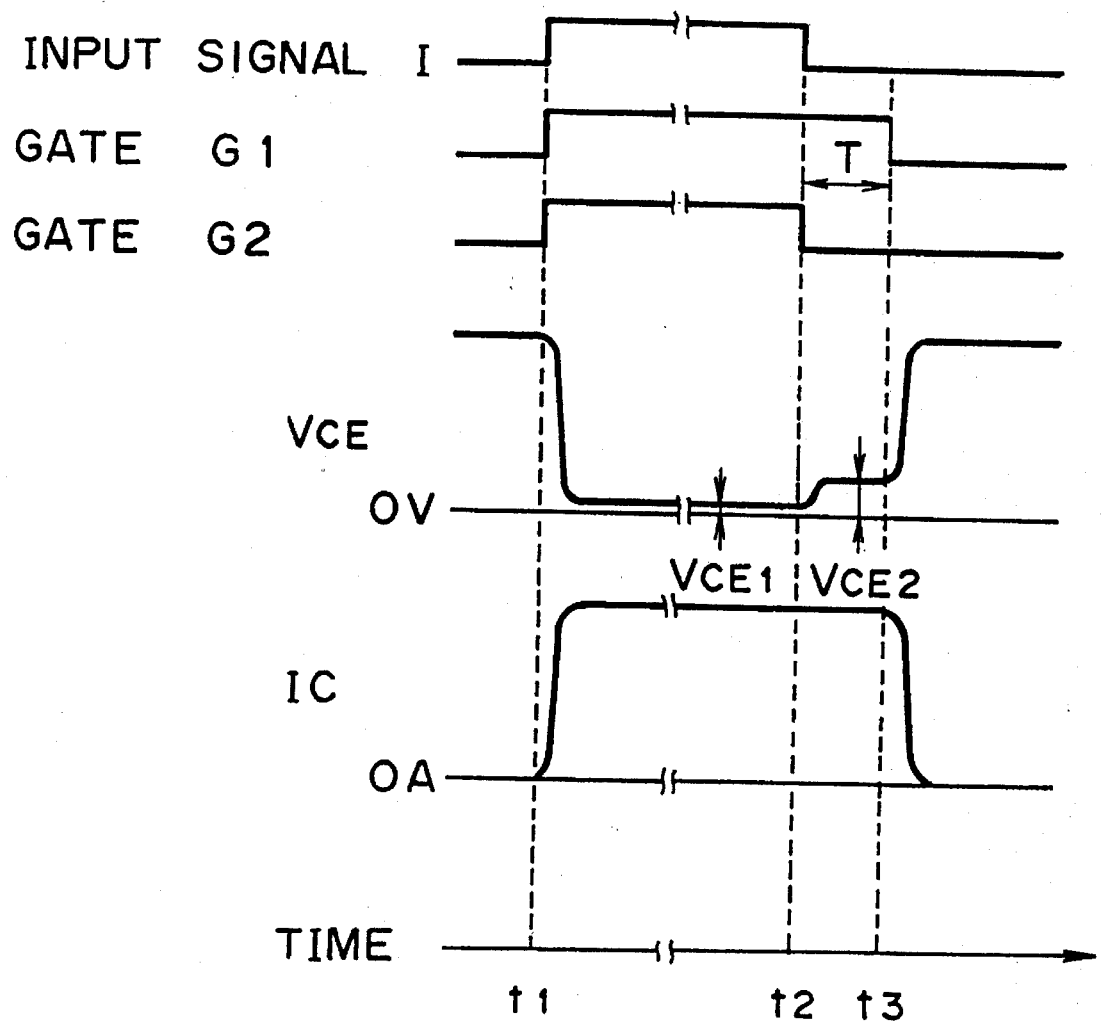
FIG. 5 is a timing chart showing the operation of the control device shown in FIG. 4.

FIG. 5 shows the operation for controlling the first double gate semiconductor device 115 using the control circuit 20. First, when an input signal I varies from a low level to a high level at a time t1, the signal is applied to the gate G1 and the gate G2. Therefore, the first double gate semiconductor device 115 becomes a thyristor condition where it is conductive under a low-on resistance, and an operating voltage Vce between an emitter E and a collector C decreases to Vce1. On the other hand, a passing current Ic passing through the emitter E and the collector C increases. Then, when the input signal I varies from a high level to a low level at a time t2, the gate G2 is applied with the low-level signal, as is, and the gate G1 is continuously applied with a high-level signal by the delay circuit 31 of the first gate control circuit 21. Therefore, the first double gate semiconductor device 115 transfers from the thyristor condition to a transistor condition which is the same condition as IGBT. At this moment, the turn-on resistor increases due to the transition from the thyristor condition to the transistor condition, and the operating voltage Vce increases from Vce1 to Vce2.

Then, since a low-level signal is applied to the gate G1 at a time t3 which is later by a delay time T than the time t2 due to the delay circuit 31, the first double gate semiconductor device 115 is turned off. Therefore, the operating voltage Vce increases, and the passing current Ic decreases.

Thus, by providing the delay circuit 31 capable of delaying the signal for a predetermined time according to the present embodiment in the first gate control circuit 21, it is possible to control the first double gate semiconductor device 115 by the single input signal I. Furthermore, by adjusting the delay time T, it is possible to apply a turn-off signal to the gate G1 after the completion of the transition from the thyristor condition to the transistor condition, thereby positively turning off the first double gate semiconductor device 115.

Embodiment 2

Figure 6:
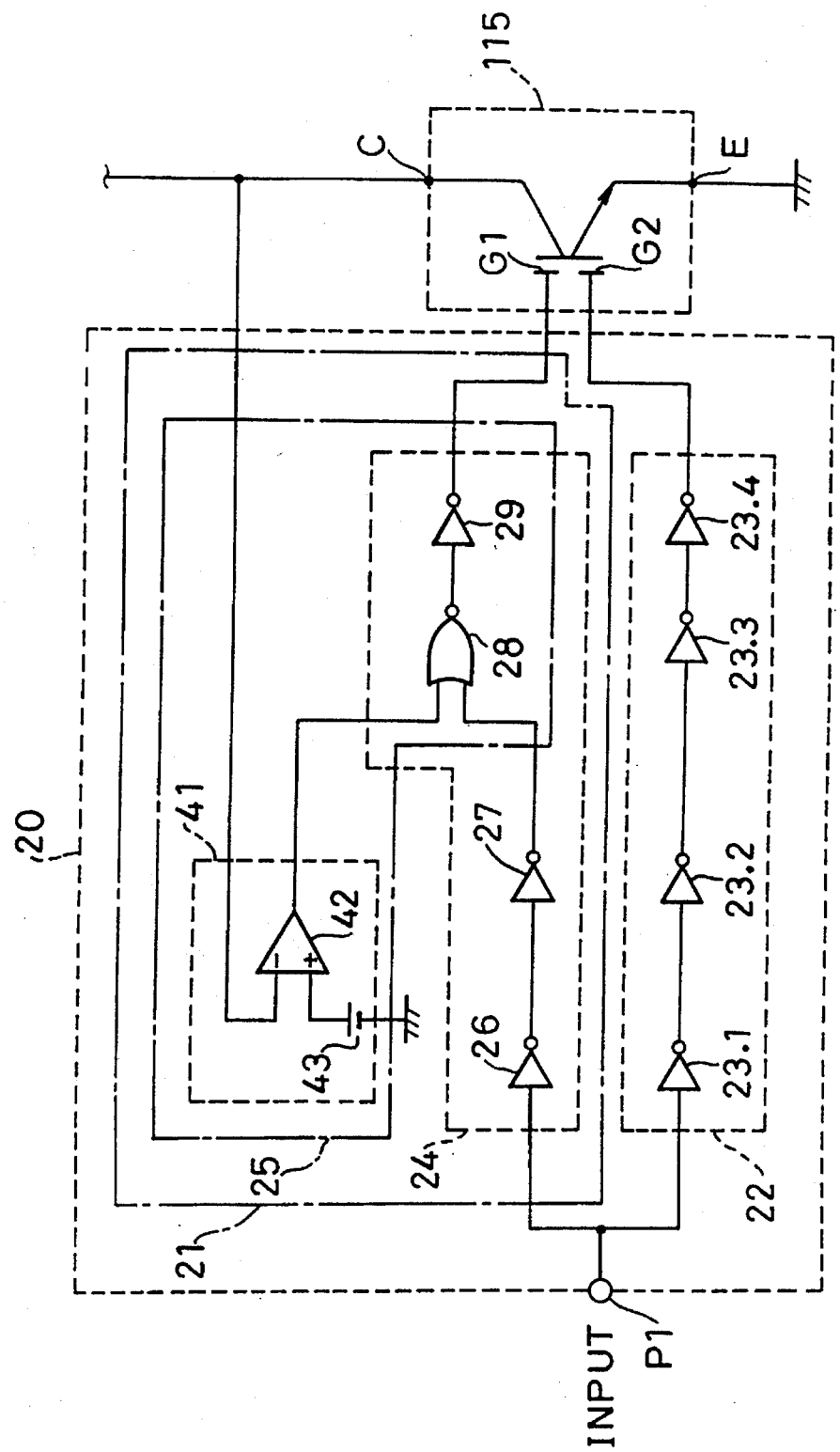
FIG. 6 is a circuit diagram showing the structure of a control device according to an embodiment 2 of the present invention.

FIG. 6 shows the structure of the control device according to an embodiment 2. The control device 20 in the present embodiment, as in the embodiment 1, is a control device for driving the first double gate semiconductor device 115 having the first gate G1 and the second gate G2, similar components are indicated by similar symbols and description thereof is omitted. The control device 20 of the present embodiment, as in the embodiment 1, comprises the first gate control circuit 21 for applying a control signal inputted to the input terminal P1 to the gate G1, and the second gate control circuit 22 for applying a control signal inputted to the same input terminal P1 to the gate G2. A point to be noted in the control device 20 in the present embodiment is that in the first gate control circuit 21, a comparator circuit 41 is provided in place of the delay circuit.

First, in the second gate control circuit 22, as in the embodiment 1, four inverters 23.1–23.4 are connected in series, and an input signal is inverted, shaped, and then applied to the gate G2 of the first double gate semiconductor device 115. Similarly, the first gate control circuit 21 comprises the ON path 24 and the OFF delay path 25. The ON path 24 comprises inverters 26 and 27, the NOR gate 28 inputted with a signal from the inverter 27 and a signal from the comparator circuit 41 of the OFF delay path 25, and an inverter 29 commonly used with the turn-off delay circuit 25.

On the other hand, the OFF delay path 25 of the present device is provided with the comparator circuit 41 applied with the operating voltage Vce appearing as a collector voltage of the first double gate semiconductor device 115, and its output is inputted to the NOR gate 28. The comparator circuit 41 comprises a comparator 42 applied with the operating voltage Vce to an inverted input, and a reference power supply 43 for generating a reference voltage applied to a non-inverted input of the comparator 42. Therefore, referring to the timing chart shown in FIG. 30, a turn-off signal is applied to the gate G2 at the time t2, when the first double gate semiconductor device 115 transfers to the transistor condition, and the operating voltage Vce increases to Vce2. Since a reference voltage V0 inputted to the comparator 42 is set to a value lower than Vce2, when the operating voltage Vce exceeds the reference voltage V0, the output of the comparator 42 is inverted. As a result, signals from the ON path 24 and the OFF path 25 coincide in the NOR gate 28, and a turn-off signal is supplied from the first gate control circuit 21 to the gate G1. This stops operation of the first double gate semiconductor device 115.

As described above, in the control device of the present embodiment, after the transition from the thyristor condition to the transistor condition is confirmed using the comparator circuit 41, a turn-off signal is applied to the gate G1. Therefore, as in the embodiment 4, the first double gate semiconductor device 115 can be controlled by a single input signal, and the first double gate semiconductor device 115 can be positively turned off.

Embodiment 3

Figure 7:
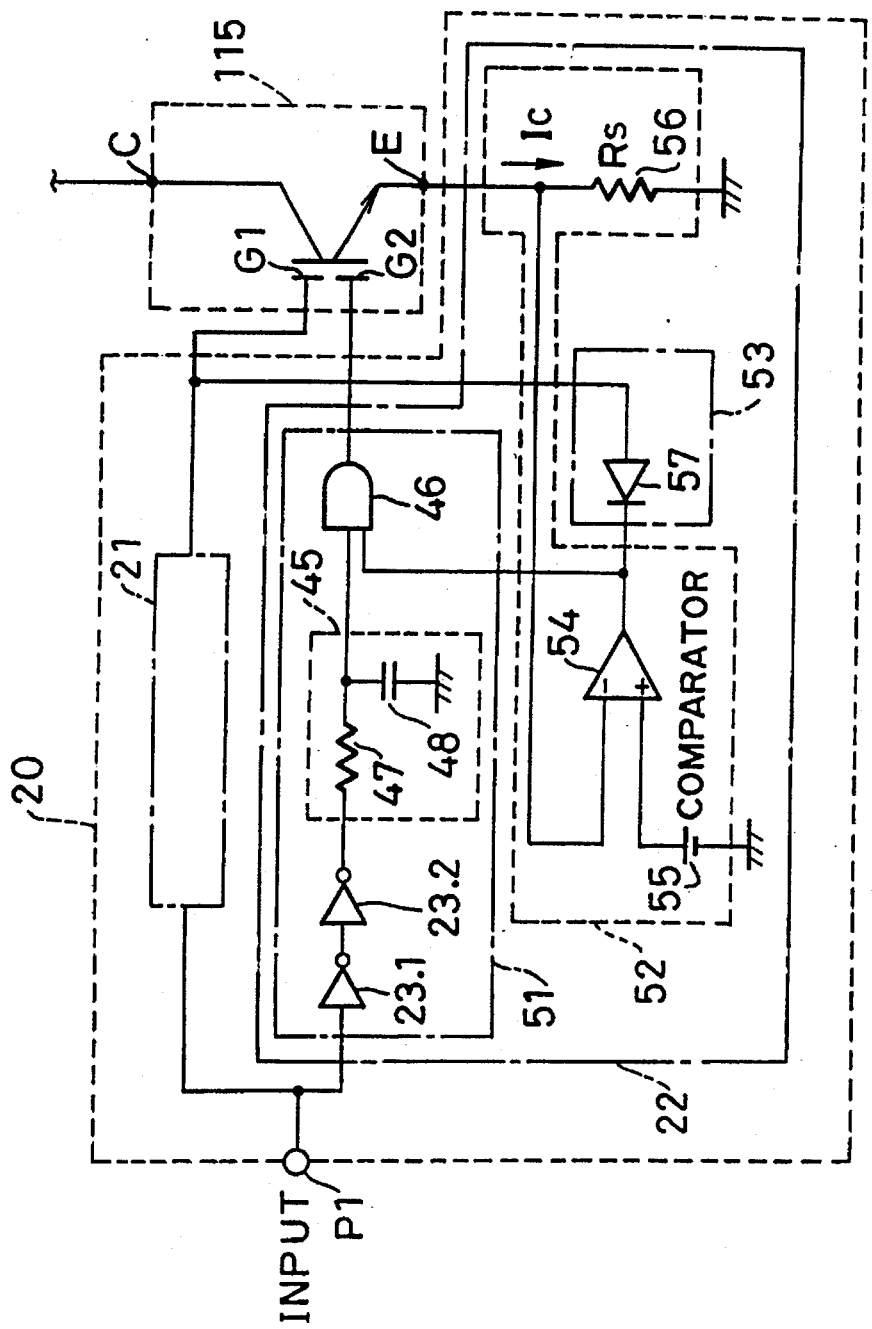
FIG. 7 is a circuit diagram showing the structure of a control device according to an embodiment 3 of the present invention.

FIG. 7 shows the structure of the control device according to an embodiment 3. The control device 20 of the present embodiment, as in the embodiment 1, is a control device for driving the first double gate semiconductor device 115 having the first gate G1 and the second gate G2, similar components are indicated by similar symbols and description thereof is omitted. The control device 20 of the present embodiment is provided with the first gate control circuit 21 of the same structure as in the embodiment 1 or embodiment 2. And, the control device 20 of the present embodiment is provided with the second gate control circuit 22 which is capable of delaying a turn-on signal to the gate G2.

That is, the second gate control circuit 22 of this device comprises a delay circuit 51 for delaying the input signal I inputted from the input terminal P1, a determination circuit 52 capable of detecting and determining the passing current Ic of the first double gate semiconductor device 115, and a turn-off signal transmission circuit 53 capable of converting a turn-on signal applied to the gate G1 to a turn-off signal according to the determination result of the determination circuit 52. Furthermore, the determination result of the determination circuit 52 is reflected to the delay circuit 51 so that a turn-on signal from the delay circuit 51 is applied to the gate G2 according to the determination result of the determination circuit 52.

First, the delay circuit 51 for delaying the input signal I from the timing applied to the gate G1 comprises two inverters 23.1 and 23.2 connected in series, a delay circuit 45 for delaying signals from the inverters 23.1 and 23.2 for a predetermined time, and an AND gate 46 inputted with a signal from the delay circuit 45 and a signal from the determination circuit 52. Therefore, the turn-on signal inputted to the input terminal P1 is first applied to the gate G1 by the first gate control circuit 21, and delayed and applied to the gate G2. Therefore, by the control device 20 of the present embodiment, first the double gate semiconductor device 115 is started from the transistor condition.

The determination circuit 52 for inputting the determination result to the delay circuit 51 comprises a detection resistor 56 through which the passing current Ic of the double gate semiconductor device 115 passes, a comparator 54 supplied to its inverted input with a voltage drop in the detection resistor 56, and a reference power supply 55 for generating a reference voltage V1 supplied to a non-inverted input of the comparator 54. Therefore, when a turn-on signal is supplied to the gate G1 and the first double gate semiconductor device 115 is in the transistor condition, the current Ic flows through the detection resistor 56, and a voltage drop proportional to the current Ic is compared with the reference voltage V1 by the comparator 54. Therefore, when a high passing current Ic exceeding a predetermined value flows under the transistor condition, a signal from the comparator 54 is inverted, and it can be determined whether or not the first double gate semiconductor device 115 is started under an overcurrent condition. When it is an overcurrent condition, the turn-on signal delayed by the delay circuit 45 can be canceled by inputting the output from the comparator 54 of the determination circuit 52 to the AND gate 46 of the delay circuit 51.

The output of the determination circuit 52 is connected to the output of the first gate control circuit 21 through the turn-off signal transmission circuit 53. The turn-off signal transmission circuit 53 comprises a diode 57 of which a current flow from the output side of the first gate control circuit 21 to the determination circuit 52 side is the forward direction. When an overcurrent is detected by the determination circuit 52 and the output of the comparator 54 is inverted, the turn-on signal applied from the first gate control circuit 21 to the gate G1 is inverted, and the turn-off signal is supplied to the gate G1.

Therefore, when an overcurrent condition is detected by the determination circuit 52, the turn-on signal to the gate G2 is canceled by the delay circuit 51, whereas, a turn-off signal is supplied to the gate G1. Therefore, the first double gate semiconductor device 115 is turned off.

Figure 8:
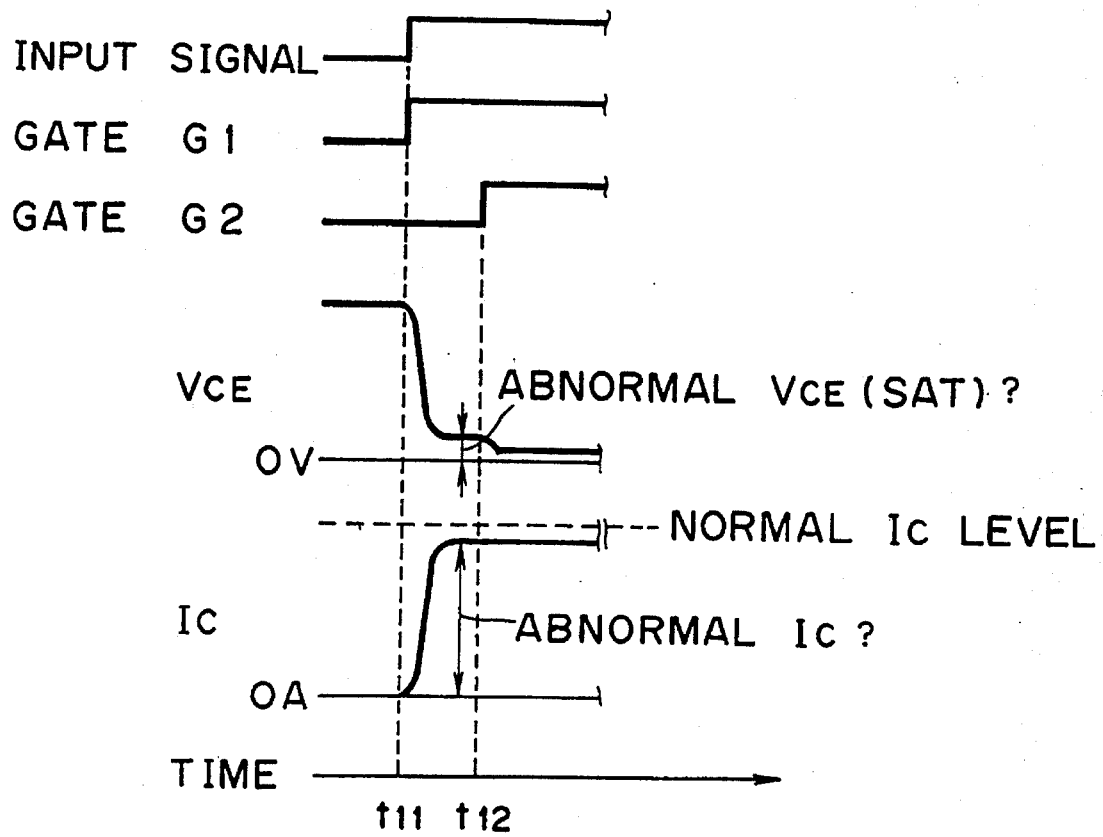
FIG. 8 is a timing chart showing the operation of the control device shown in FIG. 7 in a normal condition of the first double gate semiconductor device.

The operation of the control device 20 of the present embodiment will be described with reference to the timing charts shown in FIG. 8 and FIG. 9. FIG. 7 shows a normal start operation. First, when an input signal goes from a low level to a high level at a time t11, a high-level signal is supplied, as is, to the gate G1 by the first gate control circuit 21. On the other hand, a low-level signal is continued to be supplied to the gate G2 by the delay circuit 51 of the second gate control circuit 22. Therefore, the first double gate semiconductor device 115 is not in the thyristor condition, but is conductive in the transistor condition. As a result, the conductive current Ic flows through the detection resistor 56, and a voltage drop in the detection resistor 56 is determined by the comparator 54. When the conductive current Ic is smaller than the normal Ic level, the output of the comparator 54 is not inverted, and at the time t2 after a predetermined time, a high-level turn-on signal is supplied from the delay circuit 51 to the gate G2. The first double gate semiconductor device 115 transfers to the thyristor condition with a low-on resistance.

Figure 9:
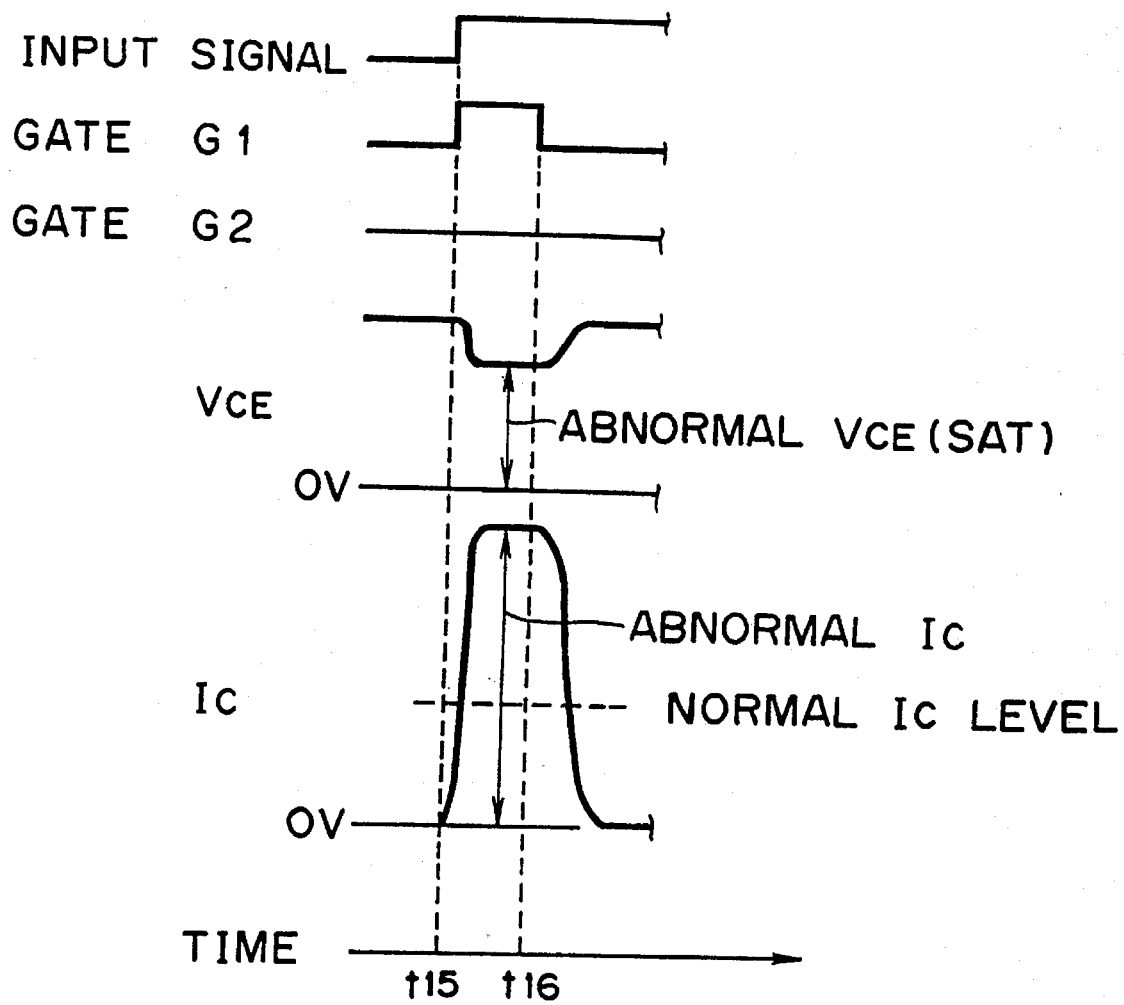
FIG. 9 is a timing chart showing the operation of the control device shown in FIG. 7 in an abnormal condition of the first double gate semiconductor device.

On the other hand, as shown in FIG. 9, when the device starts at a time 15 under the transistor condition, and when the conductive current Ic exceeds the normal Ic level, the output of the comparator 54 is inverted. Therefore, the turn-on signal is canceled in the second gate control circuit 22. Further, a turn-off signal is supplied by the turn-off signal transmission circuit 53 to the gate G1 at a time t16, and the first double gate semiconductor device 115 is turned off. Thus, with the control device of the present embodiment, the first double gate semiconductor device 115 is started in the transistor condition by the gate G1. Therefore, when an abnormality is detected by the determination circuit 52, the first double gate semiconductor device 115 can be immediately turned off by supplying a turn-off signal to the gate G1. In the prior art control device, the first double gate semiconductor device 115 is started in the thyristor condition, and even if an abnormality occurs, it is necessary to stop operation of the device after transition to the transistor condition, and the device may be unrestorably damaged during the transition. However, with the present control device, when an abnormality is detected, the device can be immediately stopped, thereby minimizing possible damages.

Figure 10:
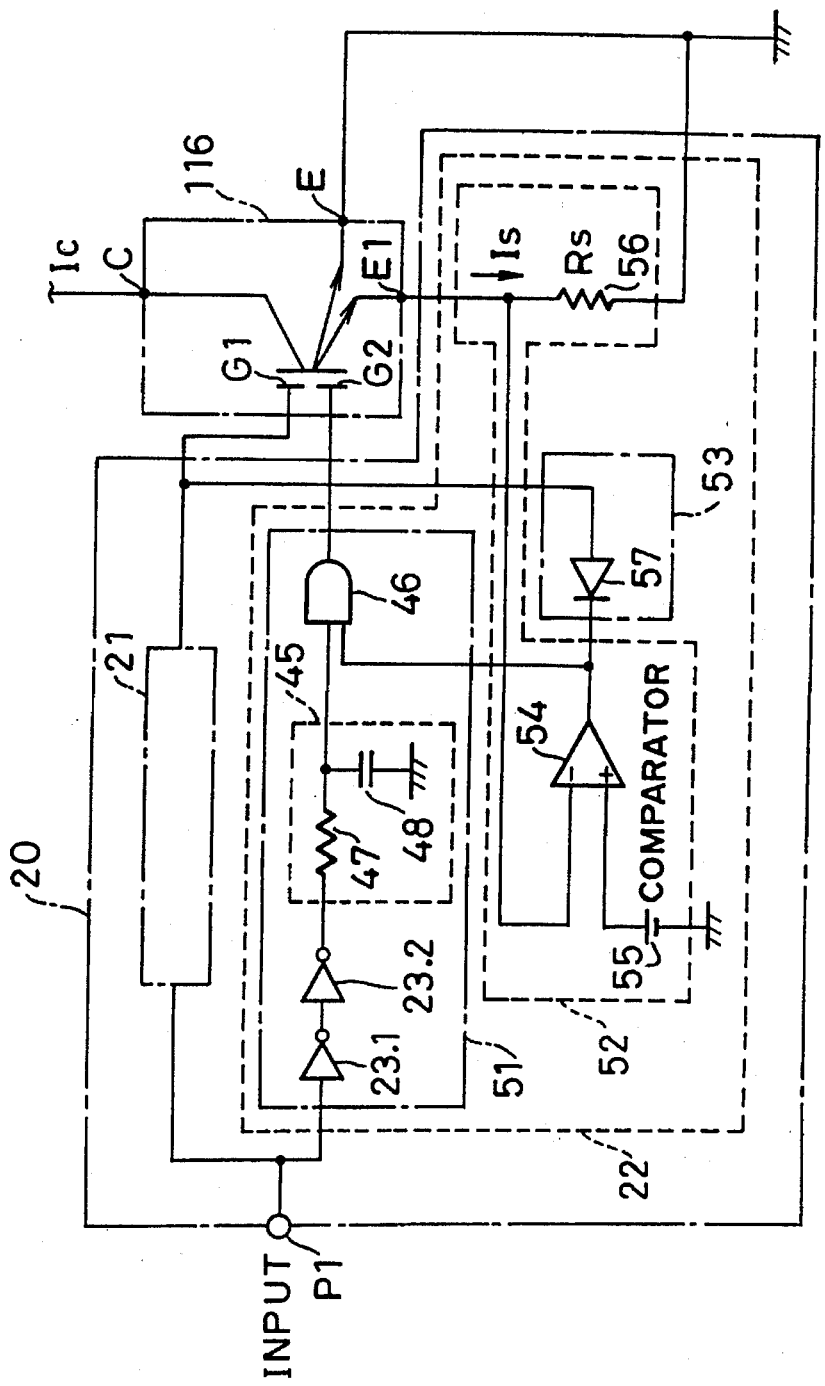
FIG. 10 is a circuit diagram showing a control device of a different structure according to the embodiment 3 of the present invention.

In the control device 20 shown in FIG. 7, the passing current Ic is determined using the detection resistor 56 connected to the emitter E side of the first double gate semiconductor device 115. However, alternatively, it is of course possible to use a sense MOS 16 provided with a sense terminal E1 as shown in FIG. 10 to detect an overcurrent from a sense current Is flowing through the sense terminal E1. This is because the sensor current Is has a relation to the passing current Ic as Is=Ic/(sense ratio), and it is possible to determine the passing current Ic. Furthermore, since it is possible to suppress a detection current flowing through the detection resistor 56 to a low value, a power generated for the detection can be suppressed.

Figure 11:
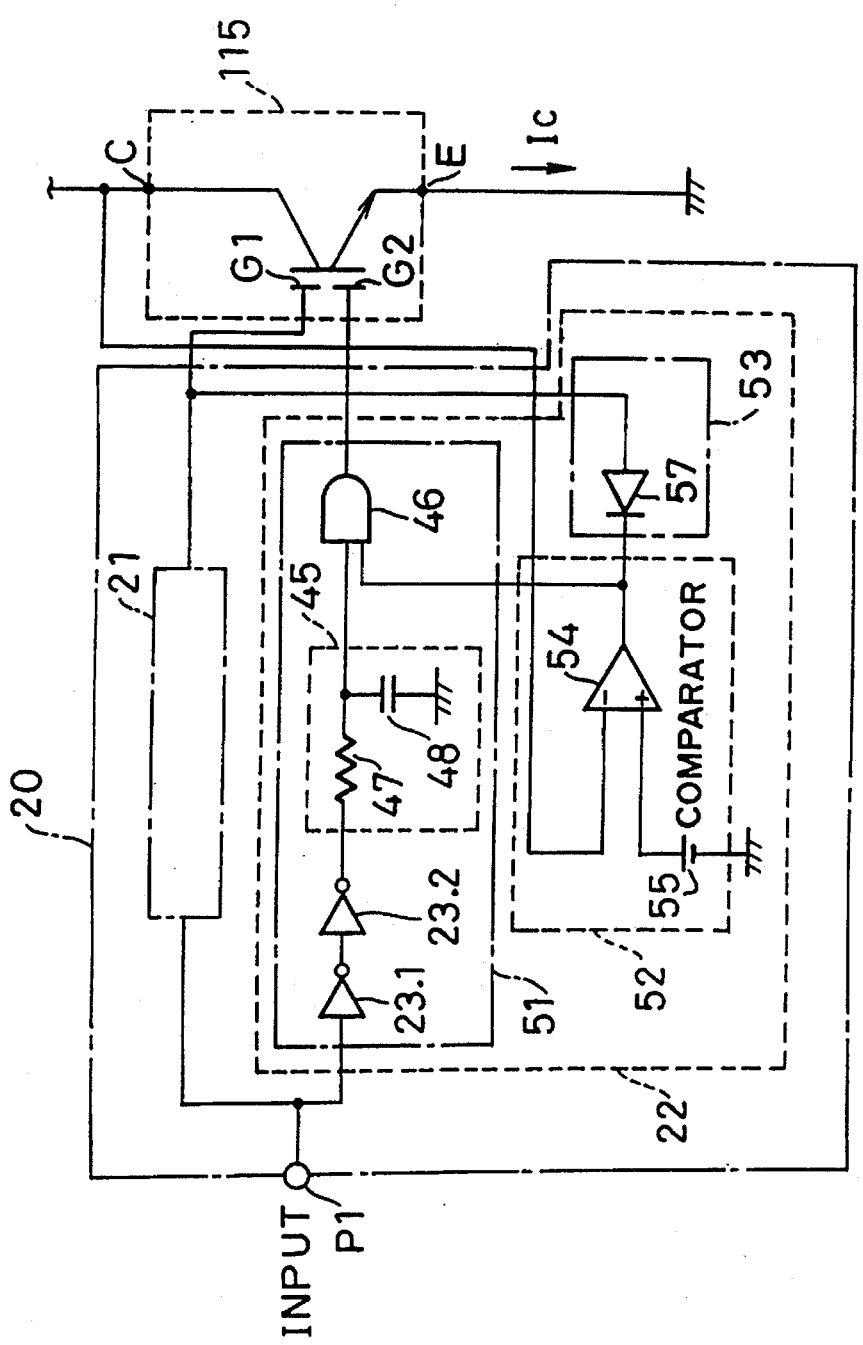
FIG. 11 is a circuit diagram showing a control device of a different structure according to the embodiment 3 of the present invent ion.

Furthermore, as shown in FIG. 11, since the operating voltage Vce increases when an abnormal Ic flows, an overcurrent condition can also be determined by supplying the operating voltage Vce to the inverted input of the comparator 54. Especially, in cases such as a low short-circuit, an arm short-circuit, and the like, Vce is almost the power supply rectification voltage, and it is sufficient to detect an overcurrent. Also with the present embodiment, a power required for the detection an be suppressed.

Embodiment 4

Figure 12:
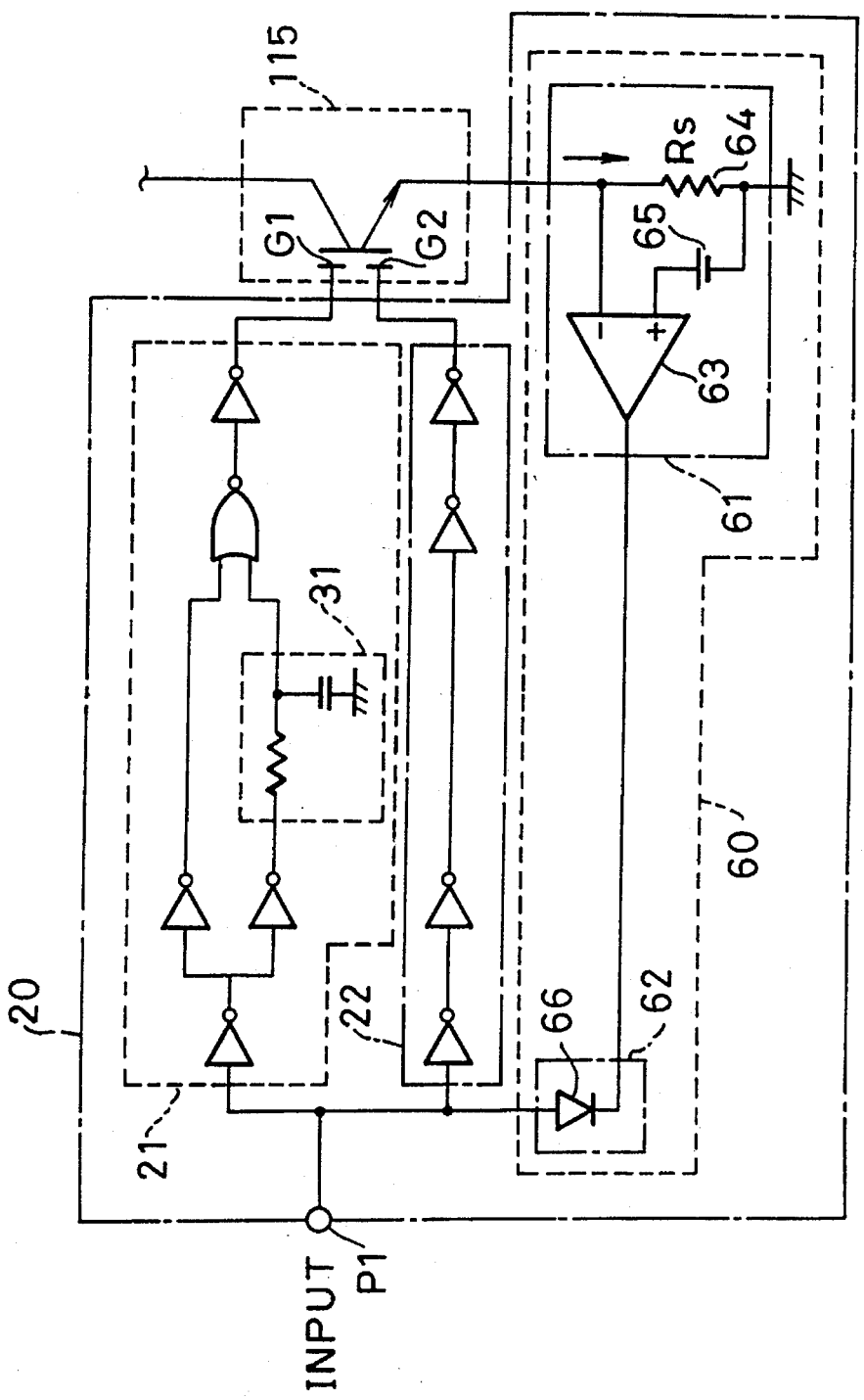
FIG. 12 is a circuit diagram showing the structure of a control device according to an embodiment 4 of the present invention.

FIG. 12 shows the structure of the control device according to an embodiment 4. The control device 20 of the present embodiment, as in the above embodiments, is a control device for driving the first double gate semiconductor device 115 having the first gate G1 and the second gate G2, similar components are indicated by similar symbols and description thereof is omitted. The control device 20 of the present embodiment is provided with the first gate control circuit 21 having the delay circuit 31 capable of delaying only a turn-off signal as in the embodiment 1, and the second gate control circuit 22 having no delay circuit. Since the circuit arrangement of these components is the same as described in the embodiment 1, description thereof is omitted. A point to be noted in the present control device 20 is that an abnormality detection circuit 60 is provided in addition to the first gate control circuit 21 and the second gate control circuit 22. The abnormality detection circuit 60 comprises a determination circuit 61 capable of determining the passing current Ic of the first double gate semiconductor device 115, and a turn-off signal output circuit 62 capable of supplying a turn-off signal to the first gate control circuit 21 and the second gate control circuit 22 according to the determination result of the determination circuit 61. Therefore, when an overcurrent flows during the operation of the first double gate semiconductor device 115, the overcurrent is determined by the determination circuit 61, when it is determined to be a current value exceeding a specified value, a turn-off signal can be supplied from the turn-off signal output circuit 62 to the first and second gate control circuits 21 and 22 to turn off the first double gate semiconductor device 115.

In such a determination circuit 61 of the abnormality detection circuit 60, as nearly the same as described in the embodiment 2, the passing current Ic is detected as a voltage drop by a detection resistor 64 connected to the emitter side of the first double gate semiconductor device 115. The voltage drop value is supplied to the inverted input of the comparator 63, and a reference voltage V2 from a reference power supply 65 is supplied to the non-inverted input of the comparator 63. Furthermore, the turn-off signal output circuit 62 comprises a diode 66 of which a current flow from the input terminal P1 to the determination circuit 61 is the forward direction. Therefore, when the passing current Ic is over a reference value, and the voltage drop in the detection resistor 64 exceeds the reference voltage V2, the output of the comparator 63 is inverted, and a low-level turn-off signal is supplied to the first and second gate control circuits 21 and 22 through the diode 62. Therefore, the first double gate semiconductor device 115 transfers from the thyristor condition to the transistor condition, and further to be turned off.

Figure 13:
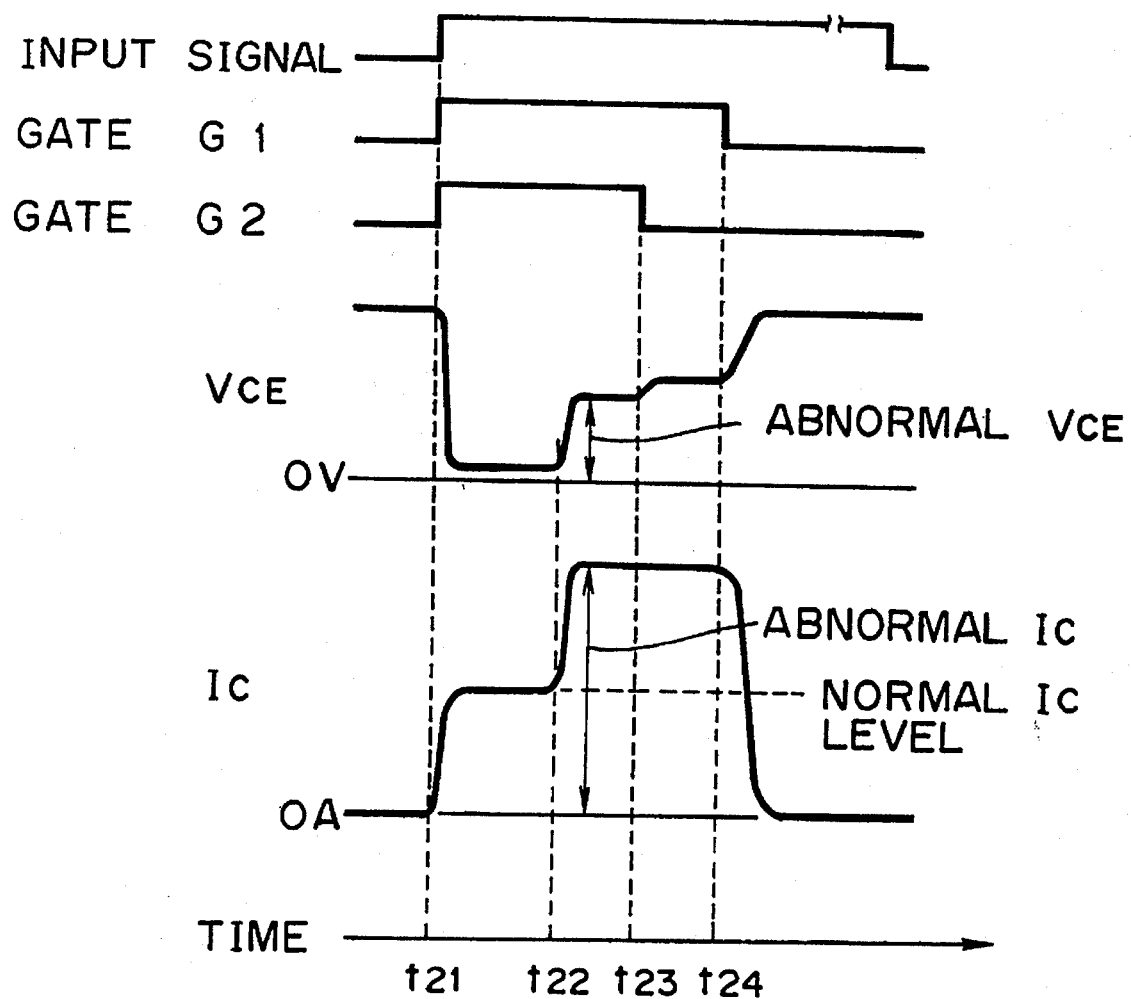
FIG. 13 is a timing chart showing the operation of the control device shown in FIG. 12.

The operation of the present device will be described with reference to the timing chart shown in FIG. 13. First, the input signal I goes to a high level at a time t21, turn-on signals are individually supplied from the first and second gate control circuits 21 and 22 to the gate G1 and G2, and the first double gate semiconductor device 115 is started in the thyristor condition. After that, when a load short-circuit, an arm short-circuit, or the like occurs at a time t22, and the passing current Ic exceeds a normal level, an overcurrent condition is determined by the determination circuit 61. As a result, a turn-off signal is outputted from the turn-off signal output circuit 62 at a time t23, and inputted to the first gate control circuit 21 and the second gate control circuit 22. Therefore, the turn-off signal is applied, as is, from the second gate control circuit 22 to the gate G2, and the first double gate semiconductor device 115 transfers from the thyristor condition to the transistor condition at the time t23. And, the turn-off signal is supplied from the first gate control circuit 21 to the gate G1 at a time t24 after a predetermined delay time, and the first double gate semiconductor device 115 is turned off.

As described above, the control device 20 of the present embodiment is provided with the abnormality detection circuit 60, and is thus possible to detect an abnormality such as an overcurrent even in the normal operation under the thyristor condition. When an abnormality is detected, a turn-off signal is automatically outputted, and the first double gate semiconductor device 115 can be stopped from the thyristor condition via the transistor condition. In the prior art control device, when such a double gate semiconductor device 115 is controlled, when an abnormality is detected by an external device, it is necessary to supply first a signal to turn off the gate G2, and then a signal to turn off the gate G1. Therefore, there has been a problem in that the first double gate semiconductor device 115 may be damaged during the time from the detection of the abnormality to the outputting the two signals. However, with the present device, an abnormal condition can be immediately detected by always determining the passing current, and a turn-off signal can be outputted within the control device. And, the first double gate semiconductor device 115 can be positively turned off by the first gate control circuit 21 using the delay circuit, thereby preventing the occurrence of possible damages.

The control device of the present embodiment uses the same circuit as in the embodiment 1 as the first gate control circuit, alternatively, however, it is also possible to use a control circuit which is confirmed the transition to the transistor condition of the semiconductor device as in the embodiment 2, and then output a turn-off signal to the gate G1. Furthermore, as a determination circuit for detecting an overcurrent, the present embodiment uses a detection resistor disposed at the downstream of the emitter E, however, as described in the embodiment 3, it is of course possible to detect the sense current in a double gate semiconductor device provided with the sense terminal E1.

Furthermore, as described in the embodiment 3, an abnormal condition can be determined from the operating voltage Vce.

Embodiment 5

Figure 14:
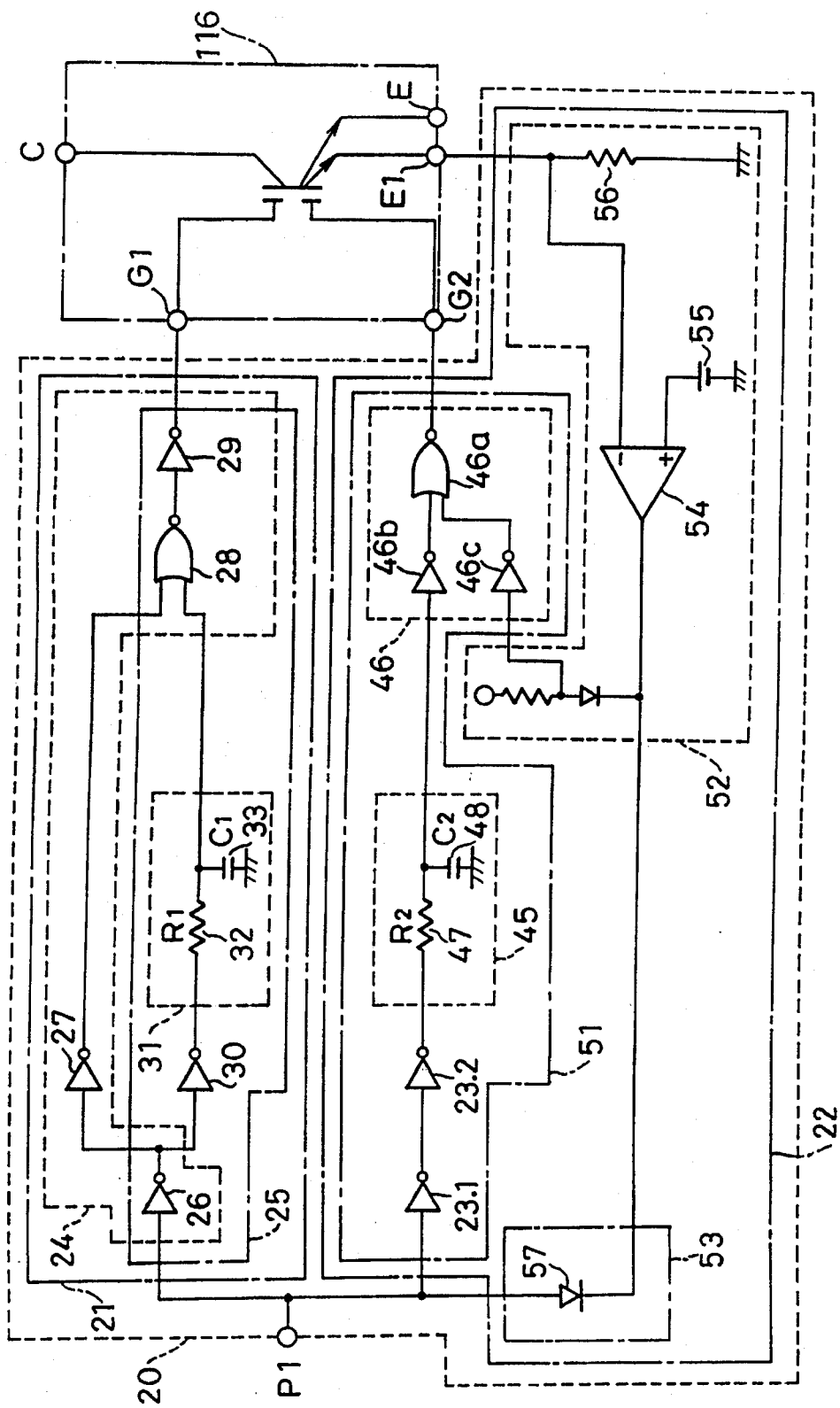
FIG. 14 is a circuit diagram showing the structure of a control device according to an embodiment 5 of the present invention.

FIG. 14 shows the structure of the control device according to an embodiment 5 of the present invention. The control device 20 of the present embodiment, as in the above embodiment 3, is a control device for driving the first double gate semiconductor device 116 with a sense MOS provided with the first gate G1, the second gate G2, and the sense terminal E1, nearly the same as the control device shown in FIG. 10. The control device 20 of the present embodiment is provided with the first gate control circuit 21 of the same structure as the embodiment 1 described with reference to FIG. 4. Furthermore, it has the second gate control circuit 22 capable of delaying a turn-on signal to the gate G2 as in the embodiment 3. Also similarly, the second gate control circuit 22 comprises the delay circuit 51 for delaying the input signal I inputted from the input terminal P1, the determination circuit 52 capable of detecting and determining the passing current Ic of the first double gate semiconductor device 116, and the turn-off signal transmission circuit 53 for converting the turn-on signal applied to the gate G1 to the turn-off signal according to the determination result of the determination circuit 52. Therefore, similar components are indicated by similar symbols, and description thereof is omitted. A point to be noted in the present embodiment is that a turn-off signal from the turn-off signal transmission circuit 53 is not applied directly to the gate G1, but turns off an input signal from the first gate control circuit 21. Therefore, the operation of the first double gate semiconductor device 116 with sense MOS can be assured even if a condition to transmit a turn-off signal is established momentarily due to a mis-operation or the like in the determination circuit 52. In the present embodiment, the AND gate 46 comprises two inverters 46b and 46c, and the NOR gate 46a, but the operation is the same as the above embodiments.

The operation of the control device 20 of the present embodiment will be described with reference to the timing charts shown in FIG. 13 to FIG. 17. The control device is provided with the delay circuit 31 in the first gate control circuit 21 to turn off the first double gate semiconductor device 116 after the transition from the thyristor condition to the transistor condition. A delay time (off-delay time) Td1 of the delay circuit 31 depends upon the product of a resistor 32 and a capacitor 33 forming the delay circuit 31, that is, upon a time constant R1.C1. On the other hand, the second gate control circuit 22 is provided with the delay circuit 45 so that the device can transfer to the thyristor operation after the operation is confirmed in the transistor operation at turning on. A delay time (on-delay time) Td2 of the delay circuit 45 depends upon the product of a resistor 47 and a capacitor 48 forming the delay circuit 45, that is, upon a time constant R2.C2. Since, not only the turn-off signal but also the turn-on signal is applied to the first double gate semiconductor device 116 past the second gate control circuit 22, the on-delay time Td2 is also the off-delay time of the second gate control circuit 22. Therefore, to turn off the first double gate semiconductor device 116 after positive transition from the thyristor operation to the transistor operation using the first gate control circuit 21, it is necessary to satisfy R1.C1>R2.C2. For this purpose, the delay circuits 31 and 45 of the control device 20 are designed so that the values of the resistors 32 and 47 and the capacitors 33 and 48 satisfy this relation.

Figure 15:
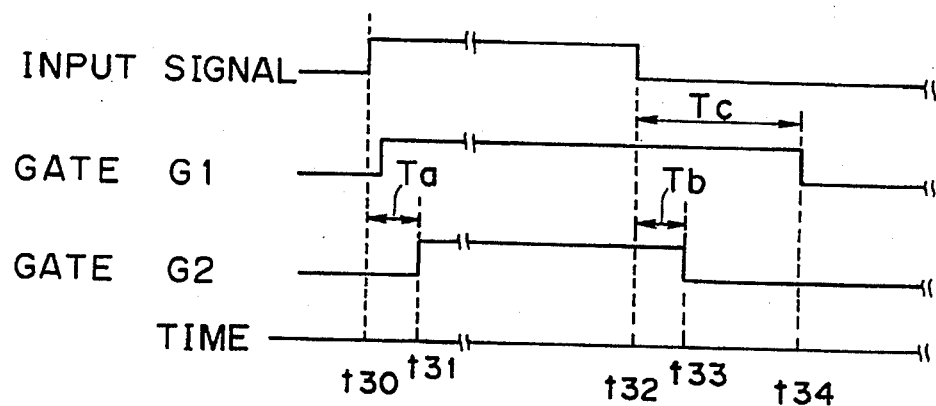
FIG. 15 is a timing chart showing the operation of the control device shown in FIG. 14 in a normal condition of the first double gate semiconductor device.

FIG. 15 shows signals applied to the gate G1 and the gate G2 in the normal ON/OFF operation. When a turn-on signal is inputted at a time t30, after an operation delay time of the ON path 24 of the first gate control circuit 21, the signal at the gate G1 goes to a high level, and the first double gate semiconductor device 116 goes to the transistor condition. And, at a time t31 after a turn-on delay time Ta of the second gate control circuit 22, the device transfers to the thyristor operation. On the other hand, when a turn-off signal is inputted at a time t32, the device transfers to the transistor operation at a time t33 after a turn-off delay time Tb of the second gate control circuit 22, and the first double gate semiconductor device 116 is turned off at a time t34 after a turn-off delay time Tc of the first gate control circuit 21 from the time t32. The above-described turn-on or turn-off delay time Td2 is the times Ta and Tb, and the turn-off delay time Td1 is the time Tc. Therefore, since the time Tc is longer than the time Tb if the relation R1.C1 >R2.C2 is satisfied, after necessary transition to the transistor operation, the gate G1 is turned off, and the first double gate semiconductor device 116 can be turned off.

Figure 16:
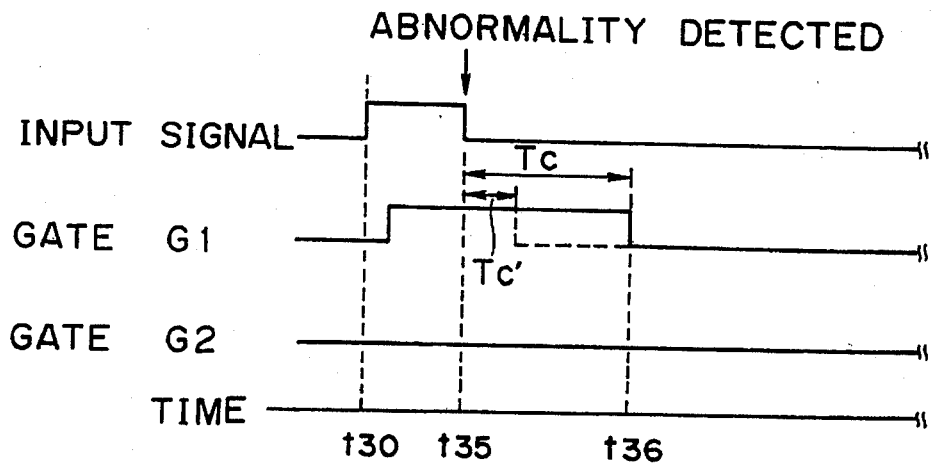
FIG. 16 is a timing chart showing the operation of the control device shown in FIG. 14 when an abnormality occurs at turning on the first double gate semiconductor device.
Figure 17:
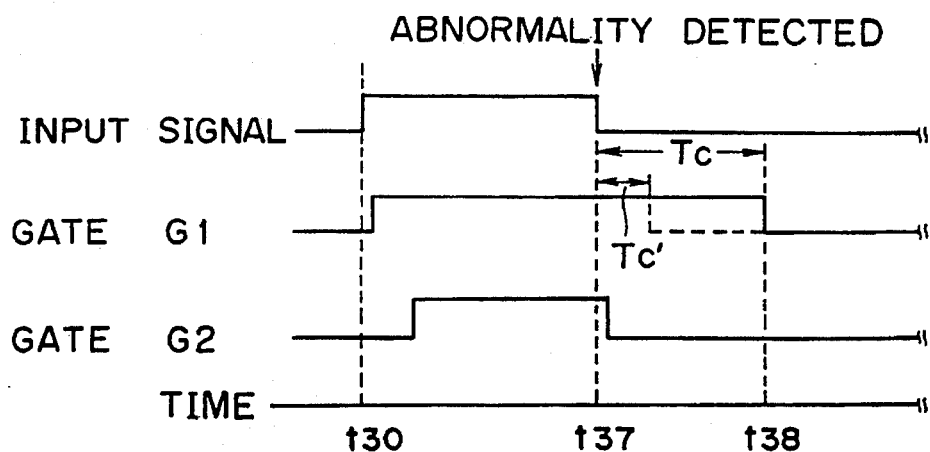
FIG. 17 is a timing chart showing the operation of the control device shown in FIG. 14 when an abnormality occurs in the thyristor condition of the first double gate semiconductor devices.

FIG. 16 shows the operation when an abnormality is detected during the transistor operation at turning on. When a turn-on signal is inputted at the time t30, after an operation delay time as in FIG. 15, a high-level signal is applied to the gate G1, and the first double gate semiconductor device is turned on in the transistor condition. When an abnormality is detected at a time t35 before the turn-on signal is applied to the gate G2, the device is turned off at a time t36 after the turn-off delay time Tc. FIG. 17 shows a case where an abnormality is detected during the thyristor operation of the first double gate semiconductor device 116. The turn-on signal is inputted at the time t30, the gate G1 and the gate G2 go to a high level, when an abnormality is detected at a time t37 after the transition to the thyristor condition, the gate G2 goes to a low level after an operation delay of the determination circuit 52 including an abnormality detection comparator and the like, and the device goes to the transistor condition. And, also the gate G1 goes to a low level at a time t38 after the turn-off delay time Tc from the time t37, and the first double gate semiconductor device 116 is turned off.

As described above, since the control device of the present embodiment goes off necessarily after the transition to the transistor condition even in an abnormal operation, it is possible to positively turn off the first double gate semiconductor device. Furthermore, since the turning off is achieved under the condition where the gate G1 is at a high level and the gate G2 is at a low level, there is no danger of the generation of latching up.

Embodiment 6

Figure 18:
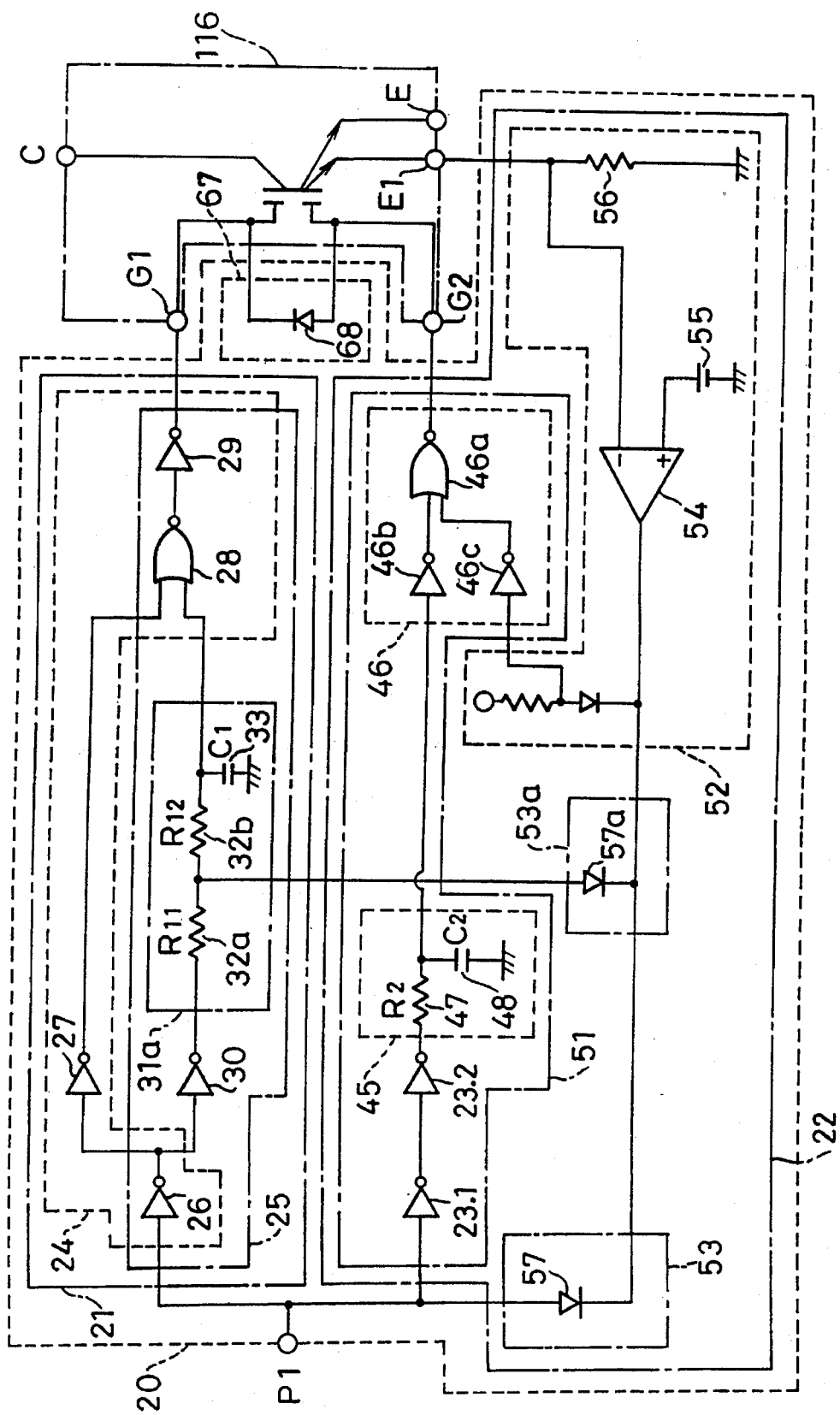
FIG. 18 is a circuit diagram showing the structure of a control device according to an embodiment 6 of the present invention.

FIG. 18 shows the structure of the control device according to an embodiment 6 of the present invention. The control device 20 of the present embodiment, as in the embodiment 2, is a control device for driving the first double gate semiconductor device 116 with a sense MOS provided with the first gate G1, the second gate G2, and the sense terminal E1, and is provided with the first gate control circuit 21 and the second gate control circuit 22. Therefore, similar components are indicated by similar symbols, and description thereof is omitted. A point to be noted in the present embodiment is that in the first gate control circuit 21, a delay circuit 31a is used as a circuit for setting the turn-off delay time, and the delay circuit 31a comprises two resistors 32a and 32b connected in series, and the capacitor 33. Also, the second gate control circuit 22 is provided with a turn-off signal transmission circuit 53a as a turn-off signal transmission circuit for abnormal condition use for supplying a turn-off signal to the delay circuit 31a, in addition to the turn-off signal transmission circuit 53 for supplying a turn-off signal to the input of the first gate control circuit 21. The turn-off signal transmission circuit 53a for abnormality use, as the turn-off signal transmission circuit 53, comprises a diode 57a, and the anode side of the diode 57a is connected to the upstream of the resistor 32b forming the delay circuit 31a, that is, the connection point of the resistors 32a and 32b.

Furthermore, a rectification circuit 67 for connecting the gate G1 and the gate G2 of the first double gate semiconductor device 116 is used, and the rectification circuit 67 also comprises a diode with the anode side being the gate G2 side.

The control device 20 of the present embodiment is a control device intended to reduce the turn-off delay time Tc off the control device shown in the embodiment 5. Specifically, in the control device of the embodiment 2 described with reference to FIG. 14, the turn-off delay time Tc for applying a low-level signal to the gate G1 is set to a sufficiently large value compared to the time Tb or Td2 for applying a low-level signal to the gate G1, whereby the transition from the thyristor condition to the transistor condition is positively achieved, and then the first double gate semiconductor device 116 is turned off. Therefore, it is a device that can assure the positive ON/OFF driving. On the other hand, even when an abnormality is detected, the device can be turned off only after the turn-off delay time Tc, which may be long for the first double gate semiconductor device 116 to be driven.

In this case, if the cause of the abnormality is an overcurrent generated due to an arm short-circuit during bridging operation, the first double gate semiconductor device 116 evolves heat during the turn-off delay time Tc and increases in temperature, which may exceed the heat resistance limit leading to a breakdown.

Thus, in the control device 20 of the present embodiment, to allow a reduction in the turn-off delay time in an abnormal condition, the delay circuit 31a capable of varying the time constant which determines the delay time is used. In the delay circuit 31a of the present device, the time constant in a normal condition, that, is, the time constant when a turn-off signal is inputted from the input terminal P1 is (R11+R12).C1. Therefore, the delay time Tc is determined by (R11+R12).C1.

On the other hand, in an abnormal condition where an overcurrent flows, the abnormality is detected in the determination circuit 52, and the output of the comparator 54 goes to a low potential. And, a low-potential turn-off signal is supplied by the turn-off signal transmission circuits 53 and 53a to the input of the first gate control circuit 21 and the upstream of the resistor 32b of the delay circuit 31a. Therefore, in the delay circuit 31a, the capacitor 33 is discharged only through the resistor 32b. Therefore, after a delay time determined by the time constant R12.C1, a turn-off signal is supplied to the NOR gate 28. Thus, in the present control device, the delay time in an abnormal condition can be reduced to R12/(R11+R12), and temperature increase in the abnormal condition is suppressed to prevent the first double gate semiconductor device 116 from breakdown. In the normal condition, a delay time Tc is applied which has a sufficient allowance for the transition from the thyristor operation to the transistor operation.

Furthermore, in the control device 20 of the present embodiment, the rectification circuit 67 to connect the gate G1 and the gate G2 is provided. As described in FIG. 15 to FIG. 17, it is necessary that the gate G1 goes to a high potential prior to the gate G2, and the gate G2 goes to a low potential prior to the gate G1. On the contrary, if the gate G2 goes to a higher potential than the gate G1, the first double gate semiconductor device 116 will be in a latch-up condition to become uncontrollable. Therefore, the mode where the gate G2 is at a high potential and the gate G1 is at a low potential is an inhibited mode. However, it is considered that the gate G2 may go to a high potential by chance due to generation of a spark voltage or the like. Furthermore, until the first double gate semiconductor device 116 is combined with the control device, or if any one of the gate G1 and the gate G2 is in an open condition even after being combined, such an inhibited mode may be achieved due to static charges or the like. Therefore, it is desirable that the inhibited mode will never be generated, and the control device of the present embodiment uses the rectification circuit 60 to prevent generation of the inhibited mode.

The rectification circuit 67 used in the control device 20 of the present embodiment comprises a diode 68. Even when a condition occurs where the potential of the gate G2 is higher than the potential of the gate G1 due to an external disturbance, clamping is established by a forward voltage of the diode 68, and generation of the above inhibited mode is prevented. Since the latch-up condition is not generated unless the potential of the gate G2 is to the extent, for example at least 3 V, that the gate can sufficiently operate as a gate, it is sufficient to use the diode 68 having a forward voltage falling in this range. As the rectification circuit 67, it is possible to use an element of a totem pole type, or an open collector type by a pull-up resistor. Although being not shown, when the gate G1 or the gate G2 is connected through a gate resistor to prevent oscillation, the rectification circuit 67 may be disposed at the upstream of the gate resistor or, of course, at the downstream.

Figure 19:
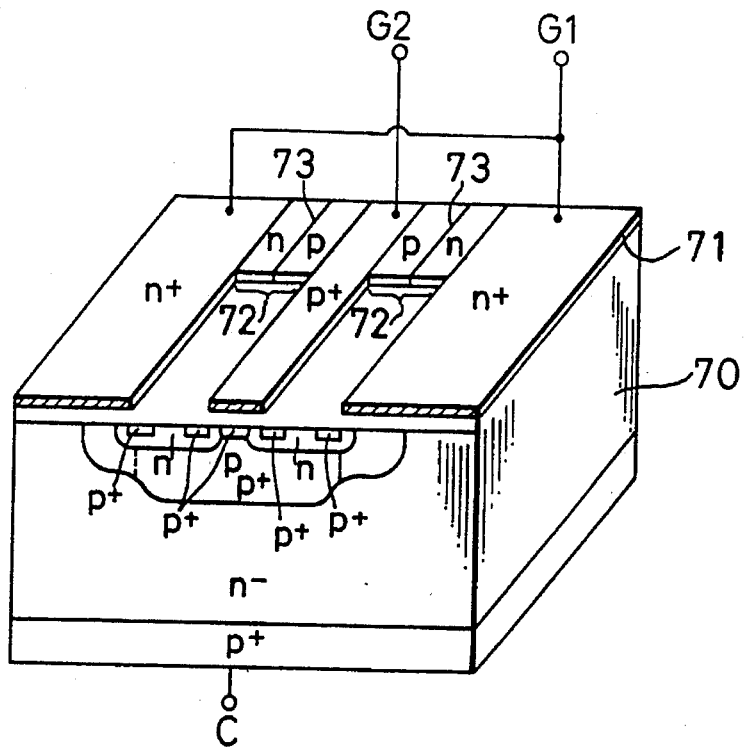
FIG. 19 is a perspective illustration showing a condition of a diode formed on the surface of a double gate MOS power device of the control device shown in FIG. 18.

FIG. 19 shows an example in which the diode 68 is formed at the first double gate semiconductor device side. The first double gate semiconductor device shown in FIG. 19 is a double gate MOS power device 70, and polysilicon-based gate electrodes G1 and G2 are formed on a surface 71 of the device. All components are shown except the emitter electrode. The gate electrode G1 is adjusted to an $n^+$ type by introducing a dopant such as phosphorus, and the gate electrode G2 is adjusted to a $p^+$ type by introducing a dopant such as boron. A polysilicon layer 72 is formed on an area between the gate electrodes G1 and G2 except for an area of the emitter electrode (not shown), and a pn junction 73 is formed by introducing a dopant. Therefore, the diode 68 can be formed by the polysilicon layer 72, and it is possible to provide the rectification circuit 67. The individual gate electrodes and the emitter electrode (not shown) are insulated by silicon oxide films. It is of course possible to form a pn junction by directly connecting the high-concentration polysilicon layers forming the gate electrodes G1 and G2, but since the diode formed tends to have a low dielectric resistance and to be difficult to maintain reliability, in the present control device, a pn junction is separately formed using the polysilicon layer 72.

Figure 20:
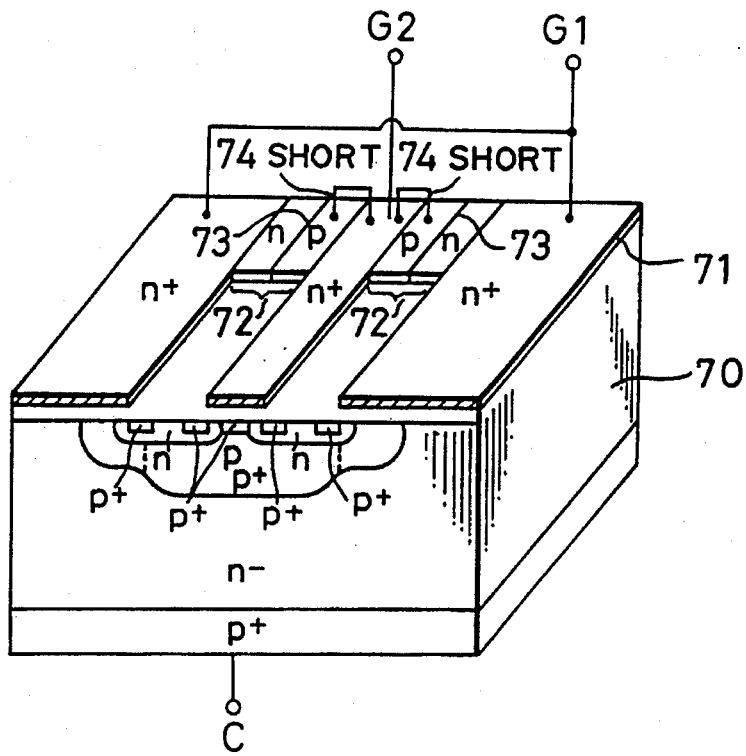
FIG. 20 is a perspective illustration showing a condition of a diode formed as in FIG. 19 where the diode and a gate electrode is connected by aluminum deposition wiring.

FIG. 20 shows an example in which a diode is formed on the surface 71 of the double gate MOS power device 70 as in FIG. 19. In the double gate MOS power device 70 shown in FIG. 20, both the gate electrodes G1 and G2 are formed of the $n^+$ type, and it is superior to the double gate MOS power device shown in FIG. 19 in view of a reduction of the polysilicon resistance. However, it cannot be connected directly to the diode 68 formed between the gate electrodes G1 and G2 also using the polysilicon layer 72. Then, in the double gate MOS power device, a window is formed in an insulating layer (not shown) on the polysilicon layer, and the $n^+$ type gate electrode G2 and a $p^-$ type portion of the diode 68 are connected with an aluminum deposition wiring 74.

As shown above, the control device 20 of the present embodiment reduces the turn-off delay time in an abnormal condition to prevent the first double gate semiconductor device from being damaged, generation of an inhibited mode is suppressed in all cases by introducing the rectification circuit, thereby achieving the safe and positive driving of the first double gate semiconductor device.

Figure 21:
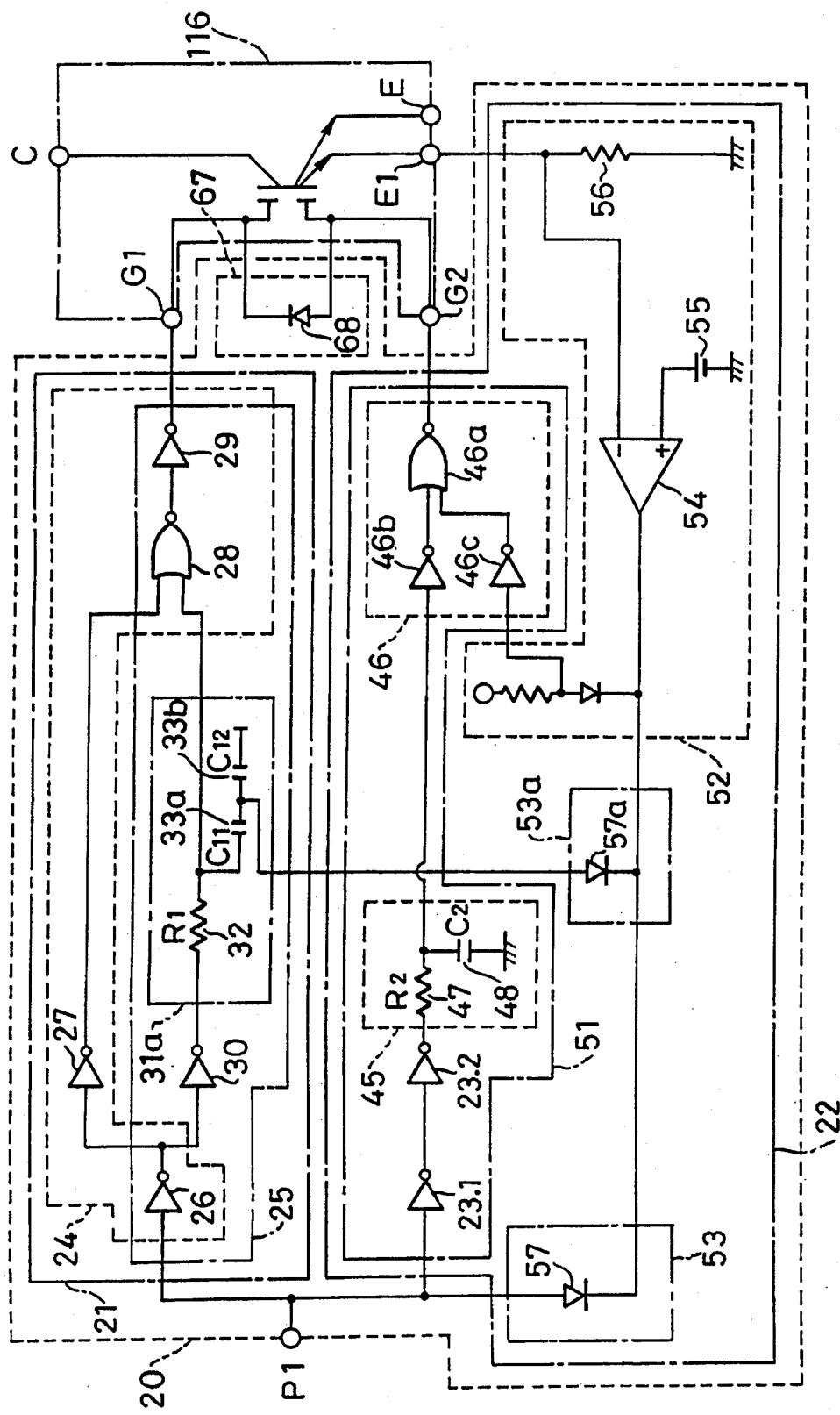
FIG. 21 is a circuit diagram showing another example of the structure of the control device according to the embodiment 6 of the present invention.

The present embodiment is described for an example where a resistor for determining the time constant of the delay circuit 31a is divided. Alternatively, however, as shown in FIG. 21, it is also possible to divide the capacitance and vary the time constant by using two capacitors 33a and 33b connected in series.

The embodiments 5 and 6 are described for the first double gate semiconductor device having a sense MOS, however, it is of course possible to determine a main current flowing between the collector-emitter of the first double gate semiconductor device.

As described above, in the control device for the first double gate semiconductor device according to the present invention, first a turn-off signal to the first double gate semiconductor device is delayed by the first gate control means capable of delaying a turn-off signal and applied to the first gate electrode, thereby stopping and controlling the first double gate semiconductor device by a single control signal. Furthermore, using the second gate control means capable of delaying a turn-on signal, it is possible to immediately turn off the first double gate semiconductor device even when an abnormality occurs at turning on, thereby preventing generation of unrestorable damages. Furthermore, when the passing current of the first double gate semiconductor device is monitored by the passing current determination means and a turn-off signal is outputted according to the value of the passing current, the first double gate semiconductor device can be protected earlier than other protective circuits.

Thus, the control device according to the present invention makes it possible to incorporate the advantageous first double gate semiconductor device that can be turned on with a low turn-on resistance as with MCT and turned off in a short time as with IGBT in power converter apparatus and the like as prior art IGBT. And, it is a control device that can prevent the first double gate semiconductor device from being damaged. Therefore, with the present control device, it is possible to widely apply double gate semiconductor devices which are power devices with reduced switching loss also in high-frequency applications.

By forming the timer delay means of the first gate control means using the first and second time constant determination units, it is possible to vary the turn-off delay time in abnormal and normal operation conditions. Therefore, in the abnormal operation condition, the turn-off delay time can be reduced to prevent the first double gate semiconductor device from exceeding the heat resistance limit and leading to breakdown, thereby achieving a reliable control device.

Furthermore, by providing the rectification means, the generation of an inhibited mode where the potential of the second gate electrode is higher than the first gate electrode can be prevented in all cases, thereby preventing an uncontrollable malfunction and improving the reliability. In particular, using the polysilicon-based diode, rectification means can be provided in the first double gate semiconductor device itself. This prevents the generation of dangers such as latch-up due to unforeseeable causes such as static charges even when the first double gate semiconductor device is handled alone, and the control device can be formed compact.

Embodiment 7

Figure 22:
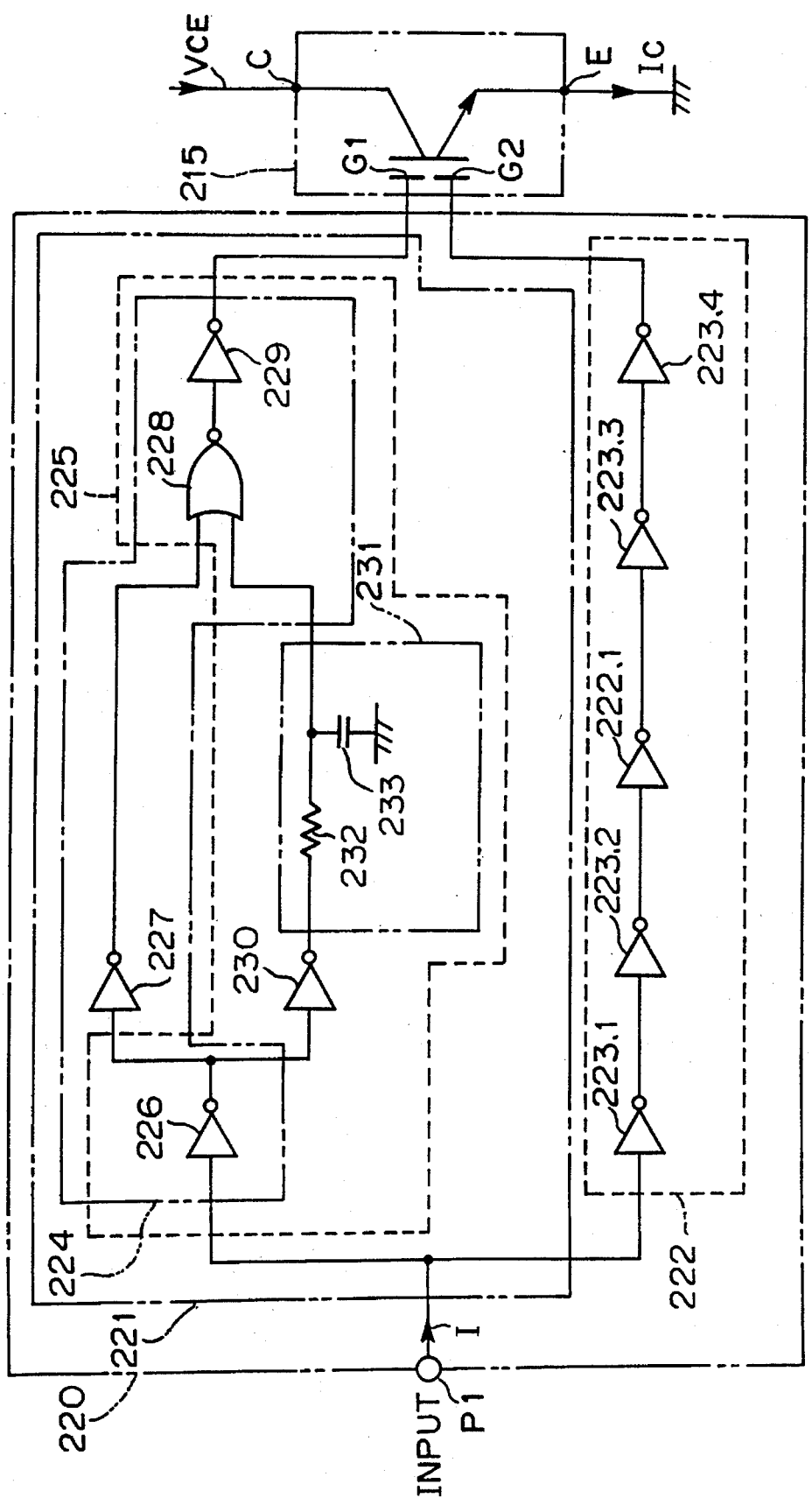
FIG. 22 is a simplified circuit diagram showing the control device for the second double gate semiconductor device according to an embodiment 7 of the present invent ion.

FIG. 22 is a simplified circuit diagram showing a control device for the double gate semiconductor device according to an embodiment 22 of the present invention. A control device 220 for driving the second double gate semiconductor device 215 comprises first gate electrode control means 221 for controlling a first gate G1 and second gate electrode control means 222 for controlling a second gate G2. The first gate electrode control means 221 comprises a pair of waveform shaping inverters 226 and 227 disposed at an input terminal P1 side of an input signal I, and an ON path comprising a series circuit of a NOR gate 228 and an inverter 229 disposed at the gate G1 side, and an off-delay path 225 comprising an inverter 230 connected between the inverter 226 and the NOR gate 228 and a delay circuit 231 (resistor 232, capacitor 233). Further, the second gate electrode control means 222 comprises a polarity reversing inverter 222.1 connected between the input terminal P1 and the second gate G2, and two pairs of waveform shaping inverters 223.1, 223.2, 223.3, and 223.4 connected in series to both sides of the above reversing inverter.

Figure 23:
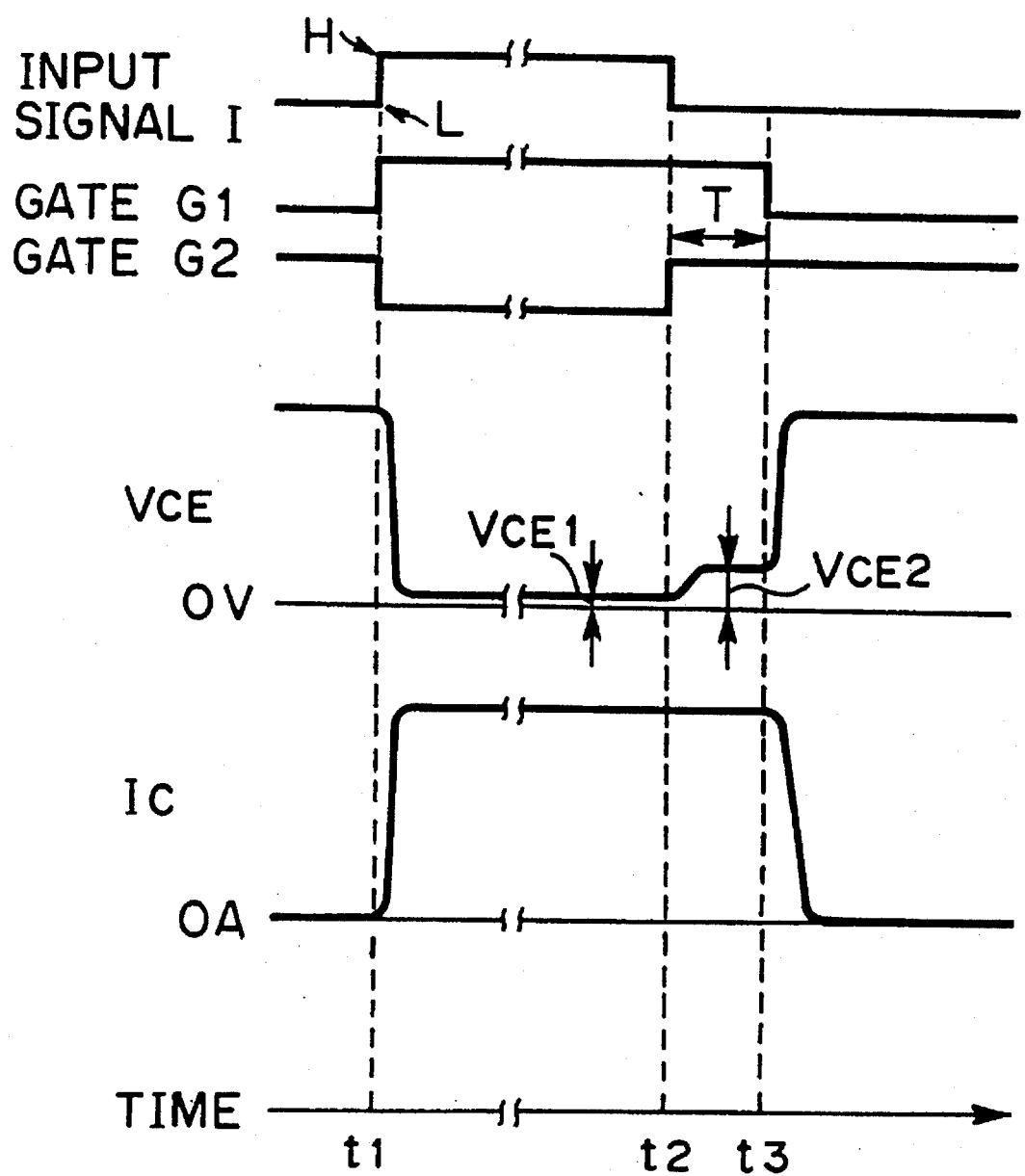
FIG. 23 is a timing chart illustrating the operation of the control device shown in FIG. 22.

FIG. 23 is a timing chart illustrating the operation of the control device of the embodiment shown in FIG. 22. In the non-operation condition of the second double gate semiconductor device 215 where the input signal I is not inputted, the first gate electrode is maintained at a low potential (L level) and the second gate electrode at a high potential (H level). At a point t1 where the input signal I rises (turn-on signal), the H level turn-on signal, waveform shaped in the ON path 224, is applied to the first gate electrode to momentarily set the second double gate semiconductor device 215 to the transistor condition, then the turn-on signal, reversed by the second gate electrode control means 222 to be the L level, is applied to the second gate electrode to transfer the second double gate semiconductor device 215 to the thyristor condition, so that the voltage VCE between the collector and emitter decreases to VCE1 less than 1 V to conduct the passing current IC with a reduced loss. At a point t2 where the input signal I falls (turn-off signal), the first gate electrode is continuously maintained at the H level by the H level signal delayed in the off-delay path, so that the potential of the second gate electrode is changed to the H level by the falling edge of the input signal I as a turn-off signal, the second double gate semiconductor device 215 transfers to the transistor condition, and VCE increases to VCE2 by the increase in the ON resistance to achieve a stand-by state of OFF operation. Then, at a point t3 where the delay time of the delay circuit 231 is elapsed, an L level turn-off signal is applied to the first gate electrode to block the passing current IC, and the double gate semiconductor device 5 transfers to the OFF state.

With the control device of the embodiment 7, since the first and second gate electrodes having voltage application modes reverse to each other can be controlled by the single input signal I, an advantage of simplifying the structure of an external device as a generation source of the input signal I can be obtained. Further, since the turn-off signal applied to the first gate electrode can be delayed by the delay circuit provided in the first gate electrode control means to set the second double gate semiconductor device 215 to the transistor condition for a period corresponding to the delay time, it is possible to make a positive turn-off operation utilizing the transistor condition, thereby preventing damages to the second double gate semiconductor device 215 due to mis-operation.

Embodiment 8

Figure 24:
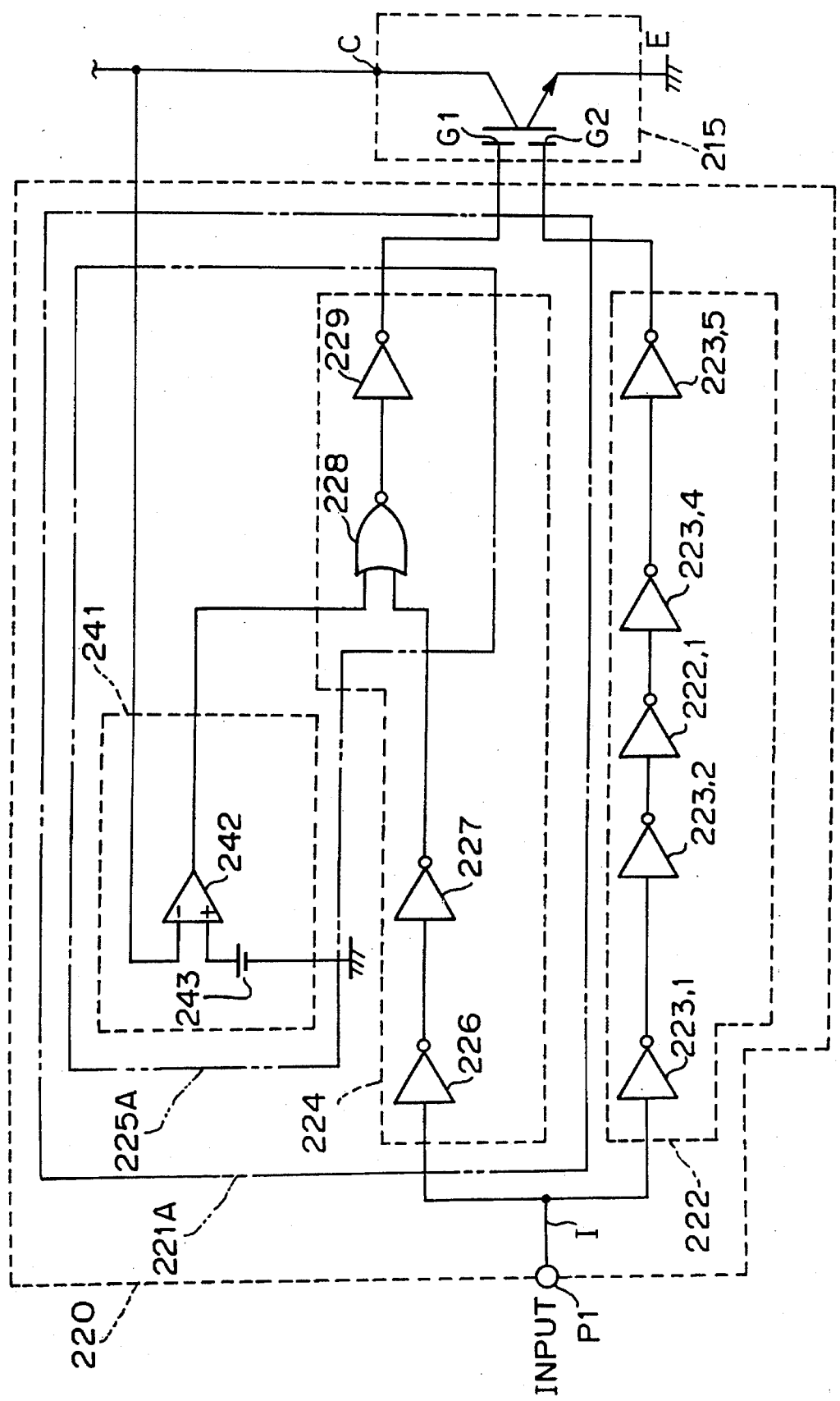
FIG. 24 is a simplified circuit diagram showing a control device for the second double gate semiconductor device according to an embodiment 8 of the present invention.

FIG. 24 is a connection diagram showing the simplified structure of the control device according to an embodiment 8 of the present invention. This embodiment differs from the embodiment 7 in that an off-delay path 225A of first gate electrode control means 221A includes a transistor condition determination circuit 241 comprising a comparator 242 and a reference power supply 243 connected to a non-reversing side of the comparator. Therefore, when the reference power supply voltage is set to a value lower than the voltage VCE2 between the collector and emitter in the transistor condition, transition from the thyristor condition to the transistor condition is detected by a voltage increase from VCE1 to VCE2, and one input of the NOR gate 228 changes to the H level. At this moment, since the signal applied from the waveform shaping inverters 226 and 227 of the turn-on path 224 to the NOR gate is already changed to the L level at the rising edge of the input signal I, inputs of the NOR gate are in line with each other, a turn-off signal is applied to the first gate electrode G1 to transfer the second double gate semiconductor device 215 to the OFF state through the transistor condition.

Thus, since in the control device of the embodiment 8, after transition from the thyristor condition to the transistor condition is checked by the comparator circuit 241, the turn-off signal is supplied to the first gate electrode to turn off the second double gate semiconductor device 215, an advantage to positively prevent the second double gate semiconductor device 215 from being damaged due to a mis-control can be obtained.

Embodiment 9

Figure 25:
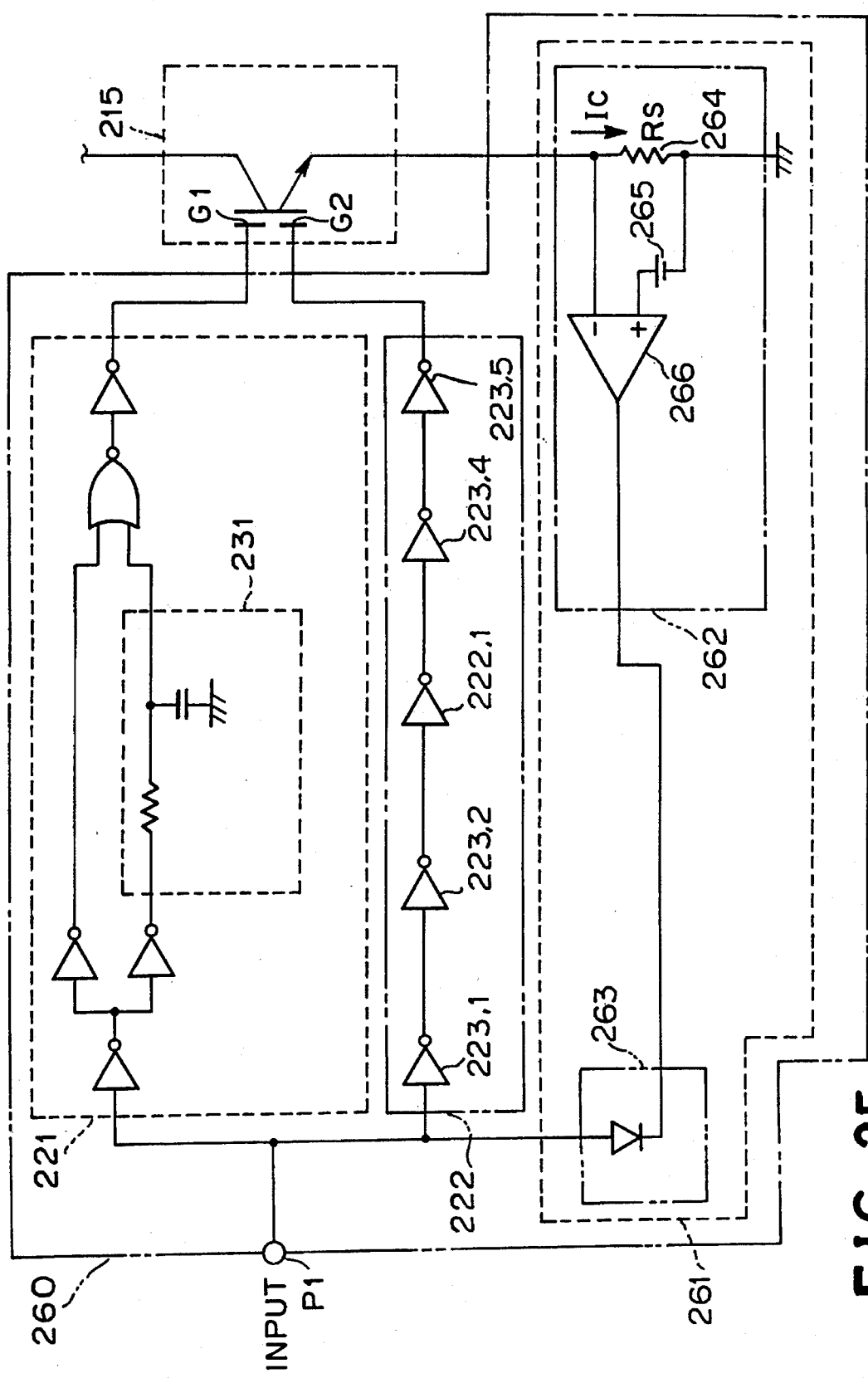
FIG. 25 is a circuit diagram showing the structure of a control device for the second double gate semiconductor device according to an embodiment 9 of the present invention.

FIG. 25 is a circuit diagram showing the simplified structure of the control device for a double gate semiconductor device according to an embodiment 9 of the present invention. The present embodiment differs from the above embodiments in that a control device 260 including first gate electrode control means 221 having timer delay means 231, and second gate electrode control means having an input signal polarity reversing inverter 222.1 is provided with abnormality detection and protective means 261 comprising a passing current determination circuit 262 capable determining an abnormality of the passing current IC, and a turn-off signal applying circuit 263 for applying a turn-off signal to the first gate electrode control means 221 according to the abnormality determination result of the passing current determination circuit. The passing current determination circuit 262 comprises an IC detection resistor 264 (resistor RS) and a comparator 266 for comparing the voltage drop with the voltage of a reference power supply 265. The turn-off signal applying circuit 263 comprises a diode connected in a forward direction where a direction from the input terminal P1 to the output side of the comparator is referred to the forward direction.

Figure 26:
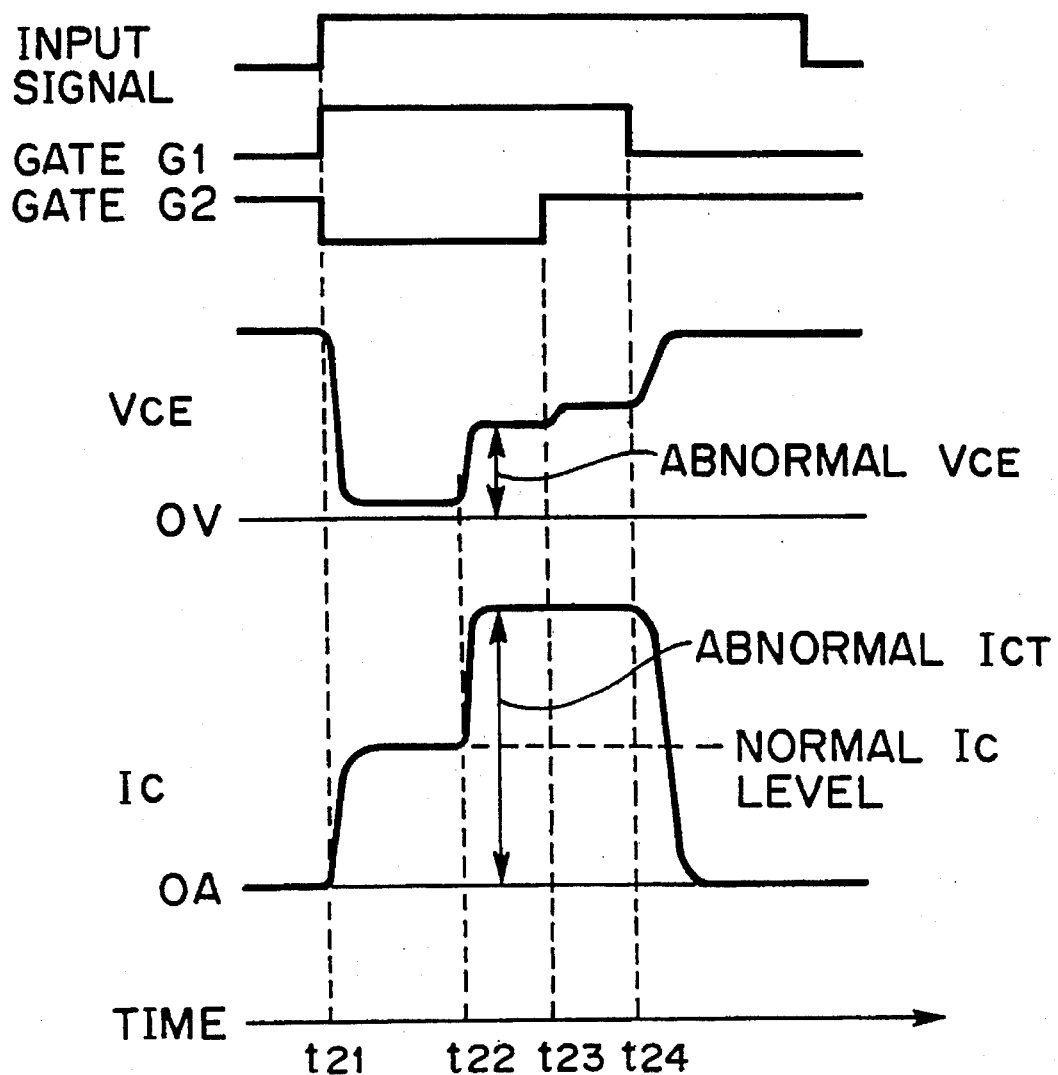
FIG. 26 is a timing chart illustrating the protective operation of the control device according to an embodiment 9 of the present invention.

FIG. 26 is a timing chart illustrating the protective operation of the control device of the embodiment 9. When the second double gate semiconductor device 215 is set to the thyristor condition at a point t21 by the first gate electrode control means 221 and the second gate electrode control means 222 and, during normal operation, an excessive current ICT occurs, for example, due to a load short-circuit, an arm short-circuit, or the like, output of the comparator 266 of the passing current determination circuit 262 is reversed to be the L level. This change is detected by the turn-off signal applying circuit 263 and the input terminal P1 potential is changed to the L level. As a result, the second gate electrode potential is changed to the H level at a point t23 through the second gate electrode control means 222, the second double gate semiconductor device 215 is transferred to the transistor condition, whereby the first gate electrode potential is changed to the L level by a time corresponding to the delay time of the timer delay means 231, and the second double gate semiconductor device 215 can be set to the OFF state at a point t24.

In the embodiment 9 of the above construction, since, by adding the abnormality detection and protective means 261 to the control device, blocking of the excessive current can be positively made during the transistor condition and in a time shorter than the duration time of the input signal, the passing time of the excessive current can be reduced, thereby reducing damages to the second double gate semiconductor device 215.

Embodiment 10

Figure 27:
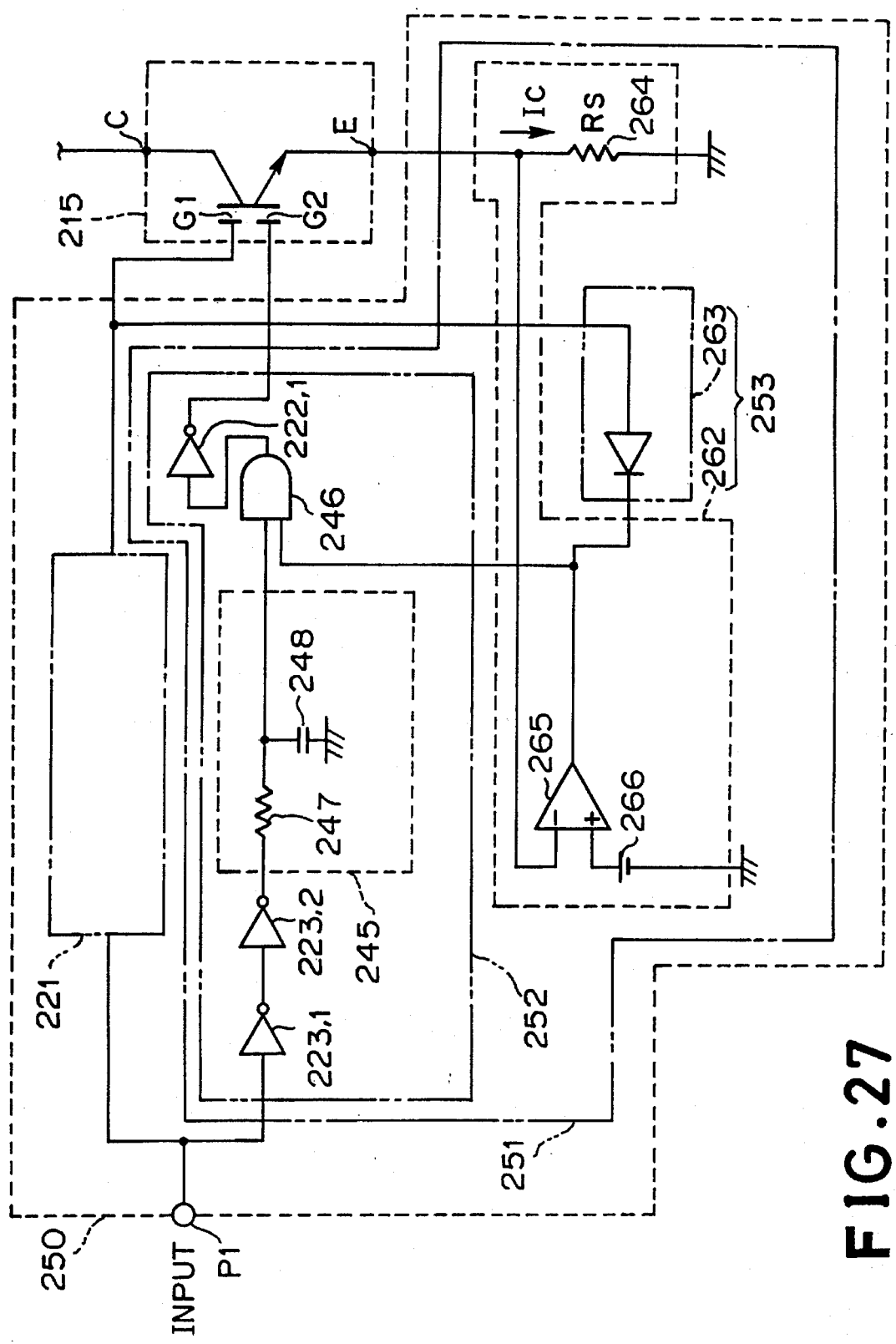
FIG. 27 is a simplified circuit diagram showing a control device for the second double gate semiconductor device according to an embodiment 10 of the present invention.

FIG. 27 is a circuit diagram showing the simplified structure of a control device for the second double gate semiconductor device 215 according to an embodiment 10 of the present invention. A control device 250 comprises first gate electrode control means formed as in the embodiment 7, and second gate electrode control means 251 for delaying the input signal and reversing the input signal according to the abnormality determination result of the passing current and applying the signal to the second gate electrode G2. That is, the second gate electrode control means 251 comprises a pair of waveform shaping inverters 223.1 and 223.2, a delay circuit 246 comprising a resistor 247 and a capacitor 248, a reversed turn-on signal applying circuit 252 comprising an AND gate 249 and a waveform reversing inverter 222.1, and abnormality detection and protective means 253 comprising a passing current determination circuit 262 capable of deter- mining an abnormality of the passing current IC of the second double gate semiconductor device 215, and a turn-off signal applying circuit 263 for outputting a turn-off signal delayed according to the determination result of the current determination circuit 262 to reversed turn-on signal applying circuit 252. The abnormality detection and protective means 253 comprises the passing current determination circuit 262 formed as in the embodiment 9, and the turn-off signal applying circuit 263 comprising a diode connected in a forward direction which is a direction from the first gate electrode G1 side to the output side of the comparator 265. Output signal of the comparator 265 is inputted to the AND gate 249 to check the AND condition with the input signal delayed by the delay circuit 246.

Figure 28:
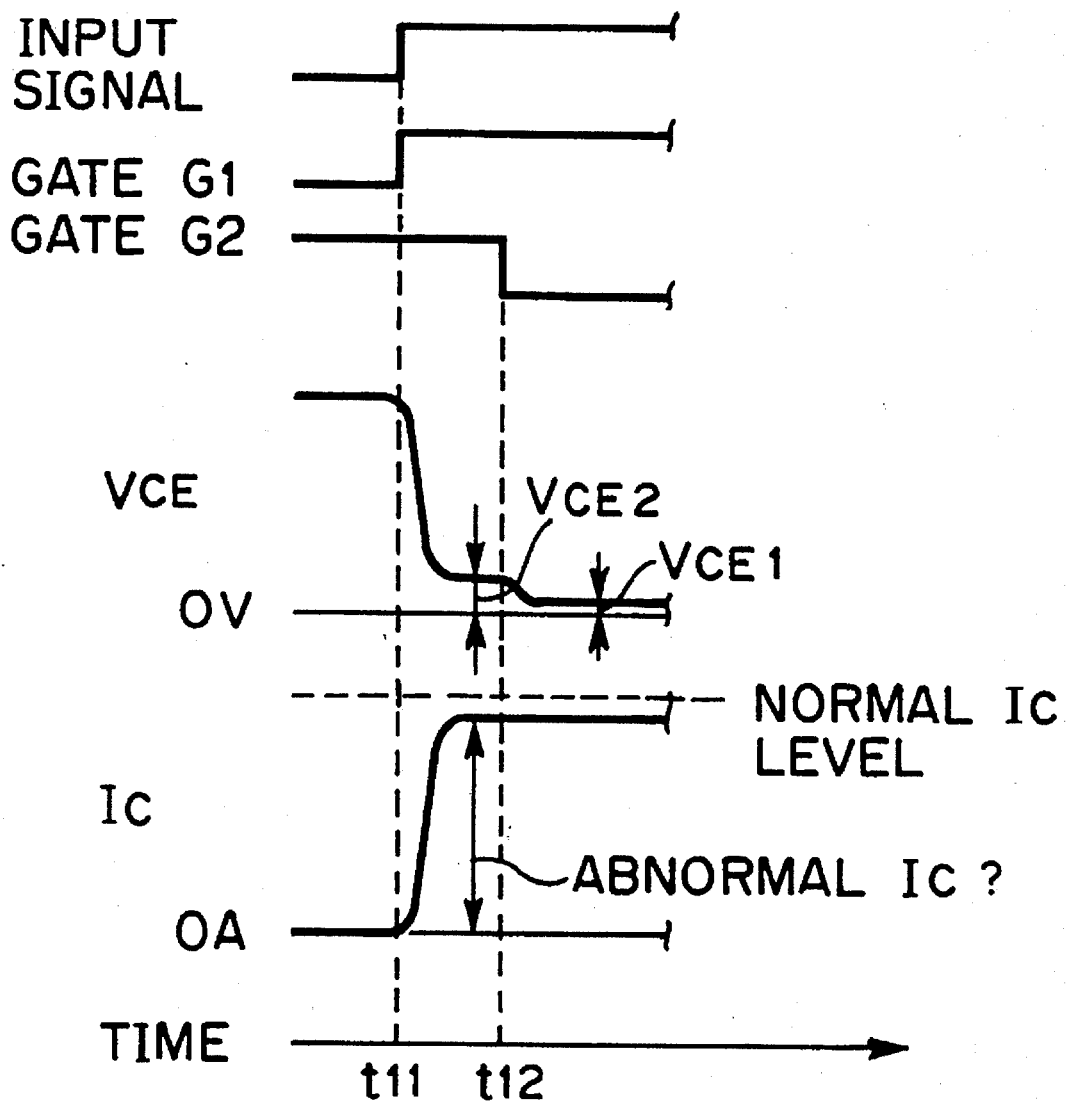
FIG. 28 is a timing chart illustrating the operation of the control device of the embodiment 10 in a normal starting condition.
Figure 29:
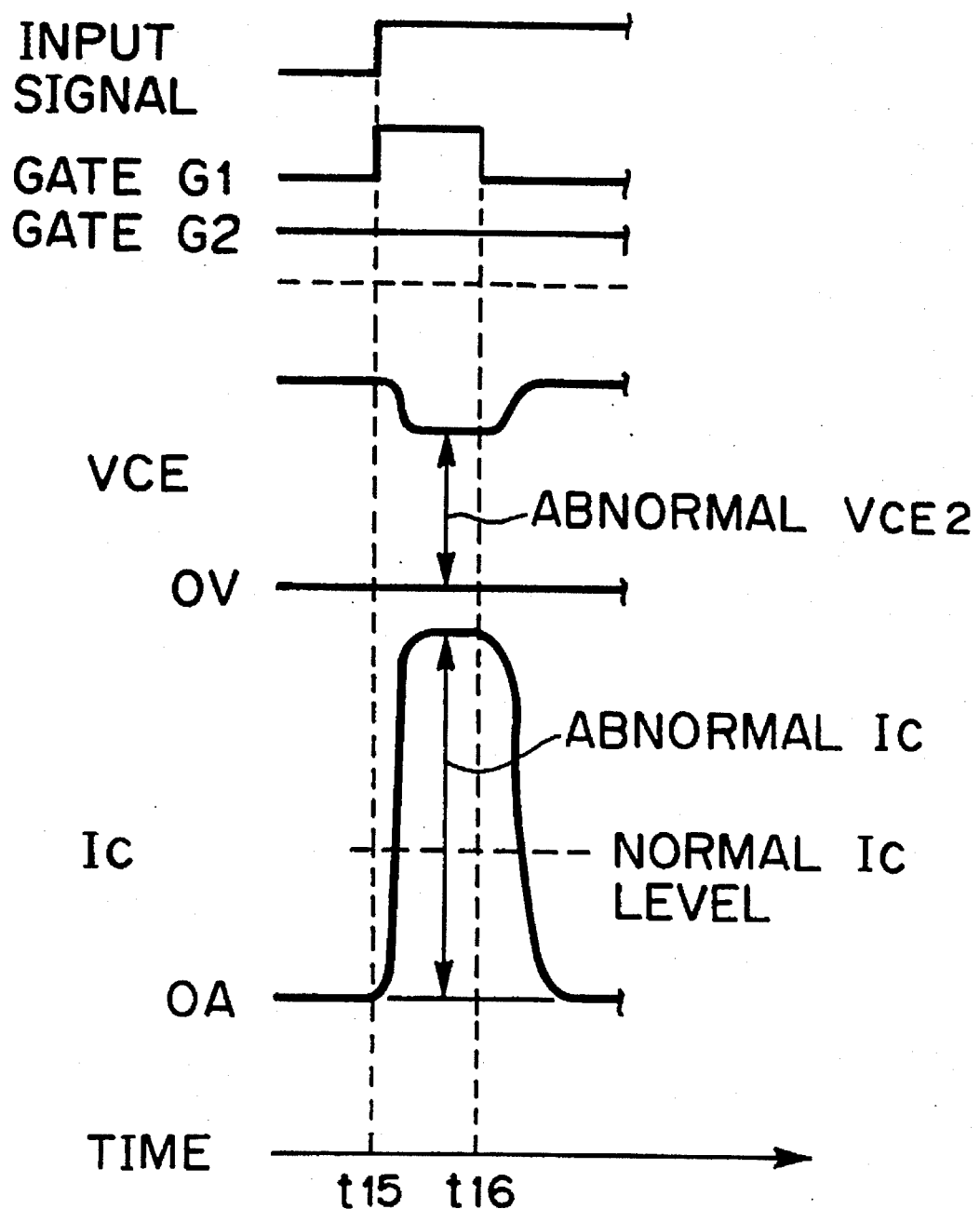
FIG. 29 is a timing chart showing the operation of the control device of the embodiment 10 in an abnormal starting condition.

FIG. 28 is a timing chart illustrating the operation of the control device of the embodiment 10 in a normal starting condition, and FIG. 29 is a timing chart illustrating the operation of the control device of the embodiment 10 in an abnormal starting condition. Referring to FIG. 28, when the input signal of the control device 250 changes to the H level at a point t11, an H level turn-on signal is applied to the first gate electrode by the first gate electrode control means. On the other hand, since in the reversed turn-on signal applying circuit 252, a delay occurs in the change to the H level of the input signal by the delay circuit 246, the second gate electrode potential is maintained at the H level in the OFF state. Therefore, the second double gate semiconductor device 215 becomes conductive in the transistor condition rather than the thyristor condition to pass the current IC, and the collector-emitter voltage VCE is decreased to VCE2. At this moment, the passing current is compared as a voltage drop of the detection resistor 264 with a reference voltage by the comparator 265 of the passing current determination circuit 262, when the passing current IC is smaller than the normal IC level, the comparator 65 output is not reversed and maintained at the H level, after a delay to a point t12 by the delay circuit 246, and when the input of the AND gate 249 is changed to the H level to meet the AND condition, a signal changed to the L level by the reversing inverter 222.1 is applied to the second gate electrode, and the second double gate semiconductor device 215 is transferred from the transistor condition to the thyristor condition.

Further, when an excessive current occurs at a point t15 immediately after the transfer to the transistor condition, this is detected by the passing current determination 262 as shown in FIG. 29, and the comparator 265 output is reversed. Therefore, output of the signal is blocked by the AND gate 249 of the reversed turn-on signal applying circuit 252, the second gate electrode potential is maintained at the H level, and the turn-on signal applying circuit 263 detects the reversing of the output of the comparator 265 to apply an L level turn-off signal to the first gate electrode. Then, the second double gate semiconductor device 215 immediately blocks the excessive current IC at a point t16 by the turn-off operation, thereby preventing the excessive current IC from damaging the second double gate semiconductor device 215.

Figure 30:
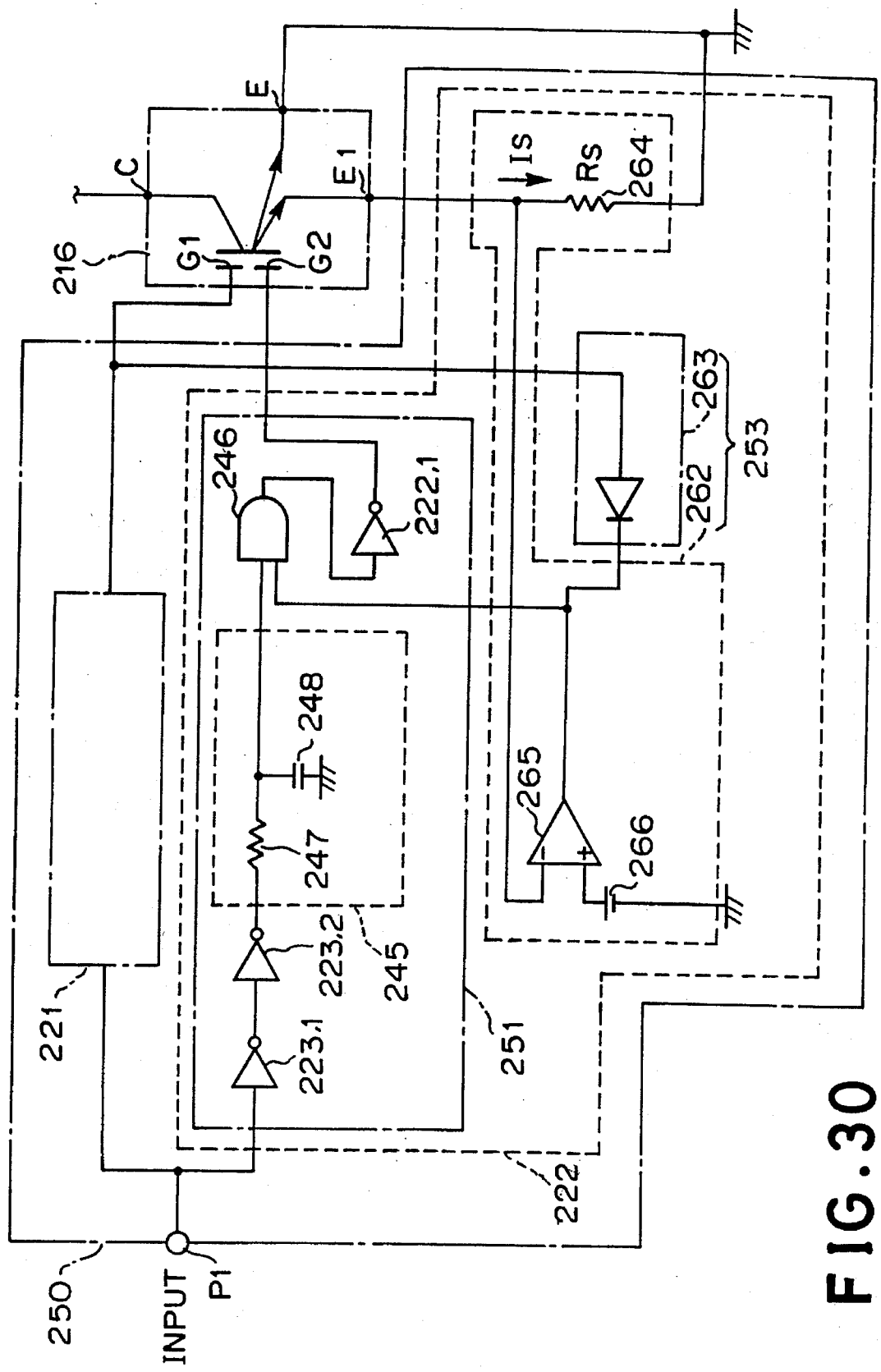
FIG. 30 is a simplified circuit diagram showing a control device for the second double gate semiconductor device according to the embodiment 10 of the present invention.

FIG. 30 is a simplified circuit diagram showing the structure of a modification example of the control device for the second double gate semiconductor device 216 according to the embodiment 10 of the present invention. This example is directed to control a sense double gate semiconductor device 216 with a sense terminal E1, in which a detection resistor 264 of the abnormality detection and protective means 253 of the control device 250 is connected to the sense terminal E1 to monitor the occurrence of an excessive current and, utilizing the small current in the sense terminal, an advantage is obtained that the current capacity of the detection resistor 264 and power loss generated in the detection resistor 264 can be reduced.

Figure 31:
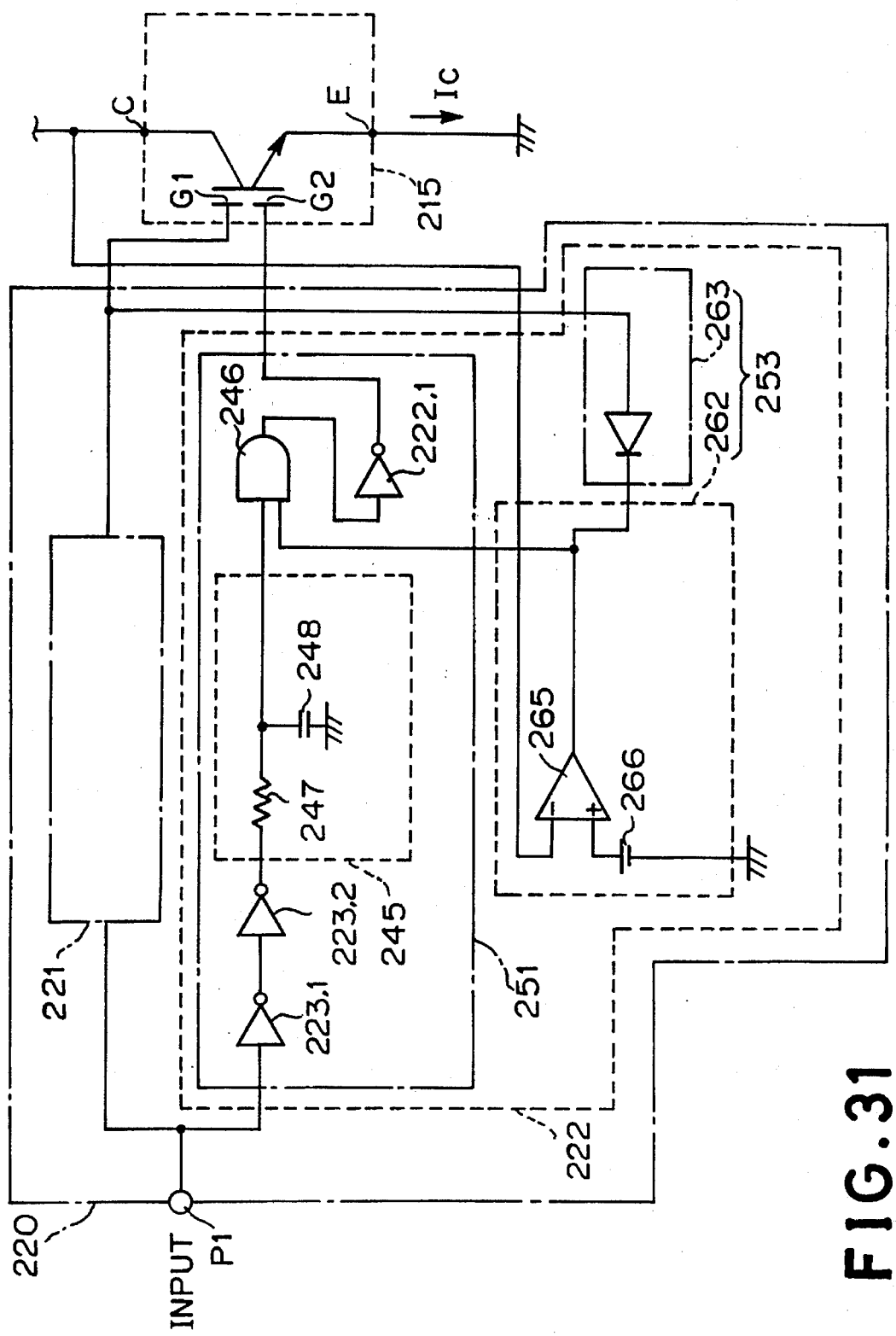
FIG. 31 is a simplified circuit diagram showing the structure of a control device according to the embodiment 10 of the present invention.

FIG. 31 is a simplified circuit diagram showing the structure of a different modification example of the control device for the second double gate semiconductor device 215 according to the embodiment 10 of the present invention. This example differs from the above embodiments in that the reversed input side of the comparator 265 of the passing current determination circuit 262 is connected to the collector terminal of the second double gate semiconductor device 215, in which an increase in the collector-emitter voltage VCE2 generated due to an excessive current (FIG. 29) is compared with the reference voltage by the comparator 265, whereby obtaining a function to block an abnormal current in a short time through the transistor condition. In particular, since, in case of a load short-circuit or arm short-circuit, VCE2 increases near to the operating voltage VCE, an overcurrent is accurately detected, and the detection resistor 264 can be eliminated, thereby removing its power loss.

Embodiment 11

Figure 32:
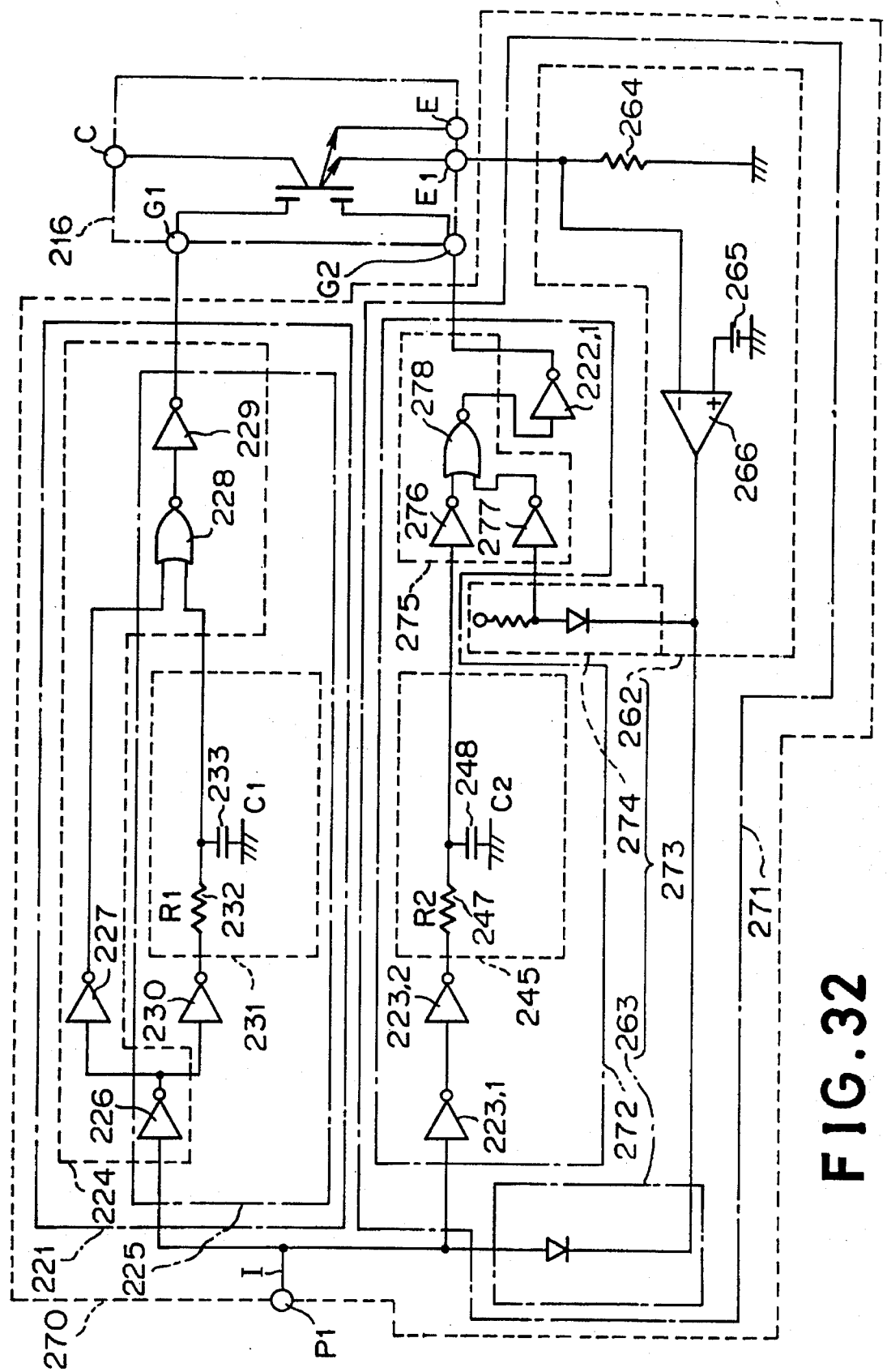
FIG. 32 is a circuit diagram showing the structure of a control device for the second double gate semiconductor device according to an embodiment 11 of the present invention.

FIG. 32 is a circuit diagram showing a control device for the second double gate semiconductor device 216 according to an embodiment 11 of the present invention, in which a sense double gate semiconductor device with the sense terminal E1. Referring to the Figure, a control device 270 comprises first gate electrode control means 221 constructed as in the embodiment 7, and second gate electrode control means 271 for reversing the polarity of an input signal and applying the signal to the second gate electrode according to the abnormality determination result of the passing current value. That is, the second gate electrode control means 271 comprises a delay circuit 245 comprising a resistor 247 and a capacitor 248, and abnormality detection and protective means 273 comprising an AND gate 275 comprising inverters 276 and 277 and a NOR gate 278, a passing current determination circuit 252 capable of determining an abnormality of the passing current IC of the second double gate semiconductor device 216, a turn-off signal applying circuit 263 for outputting an L level turn-off signal to the input terminal P1 according to the determination result of an overcurrent of the current determination circuit 262, and a turn-off signal applying circuit 274 for outputting an L level turn-off signal to the inverter 277 of the reversed turn-on signal applying circuit 272, wherein the delay time of the delay circuits 231 and 245 are set to satisfy the condition T31>T45.

Figure 33:
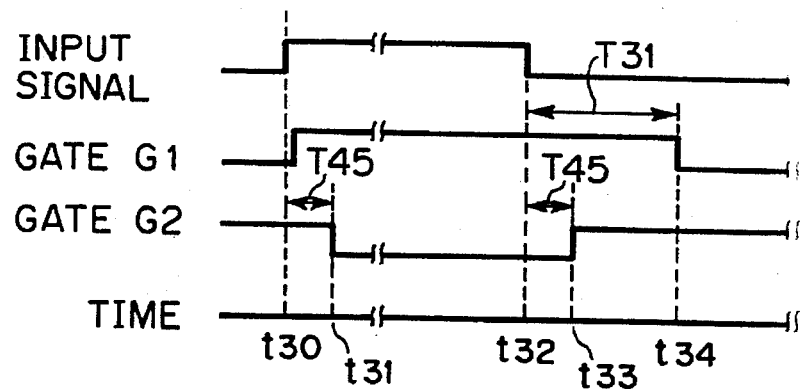
FIG. 33 is a timing chart illustrating changes in gate voltage of the control device of the embodiment 11 in a normal operation.

FIG. 33 is a timing chart illustrating changes in gate voltage of the control device of the embodiment 11 in normal operation. When the input signal 1 changes to the H level at a point t30, the first gate electrode potential goes to the H level through the first gate electrode control means 221, and the second double gate semiconductor device 216 is transferred from the OFF state to the transistor condition. Then, at a point t31 delayed by the delay time T45 of the on-delay circuit 245 of the reversed turn-on signal applying circuit 272, the H level signal passes through the AND gate 275, converted to an L level signal by the reversing inverter and applied to the second gate electrode, and the second double gate semiconductor device 216 is transferred to the thyristor condition. On the other hand, when the input signal changes to the L level at a point t32, at a point t33 delayed by the time T45 the second gate electrode potential goes to the L level, the second double gate semiconductor device 216 is transferred to the transistor condition and, at a point t34 delayed by the time T31 from the point t32, the first gate electrode potential goes to the L level, and the second double gate semiconductor device 216 is transferred to the OFF state. Therefore, by setting the delay time of the delay circuits 231 and 245 to satisfy the condition T31>T45, the second double gate semiconductor device 216 can be transferred to the OFF state through the transistor condition, thereby positively blocking the passing current IC.

Figure 34:
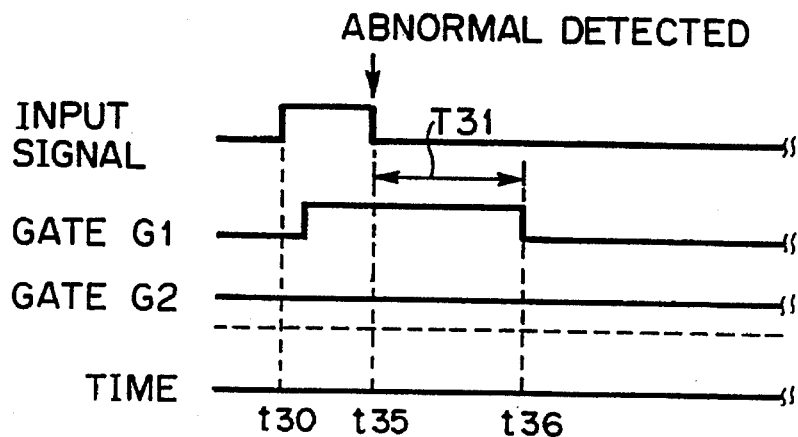
FIG. 34 is a timing chart illustrating changes in gate voltage of the control device of the embodiment 11 when an overcurrent occurs in the transistor condition.

FIG. 34 is a timing chart illustrating changes in gate voltage when an overcurrent occurs in the transistor condition. It is assumed that the input signal 1 changes to the H level at a point t30, and an overcurrent generates at a point t35 at which the second double gate semiconductor device 216 is transferred from the OFF state to the transistor condition. At this moment, the overcurrent is detected by the passing current detection circuit 262, and an L level turn-off signal is applied to the input terminal P1 and the inverter 277 by the turn-off signal applying circuits 263 and 274. When the input of the inverter 277 changes to the L level, the gate signal, which is reversed three times by the inverter 277, the NOR gate 278, and the reversing inverter 222.1 to be the H level, is applied to the second gate electrode and, by the L level signal, which reaches the inverter 276 with a delay of T45, the second gate electrode is continuously maintained at the H level. On the other hand, the L level turn-off signal applied to the input terminal P1 by the turn-off signal applying circuit 263 is applied to the first gate electrode at a point t36 delayed by the time T31 by the off-delay path 225 of the first gate electrode control means 221, thereby transferring the second double gate semiconductor device 216 from the transistor condition to the OFF state.

Figure 35:
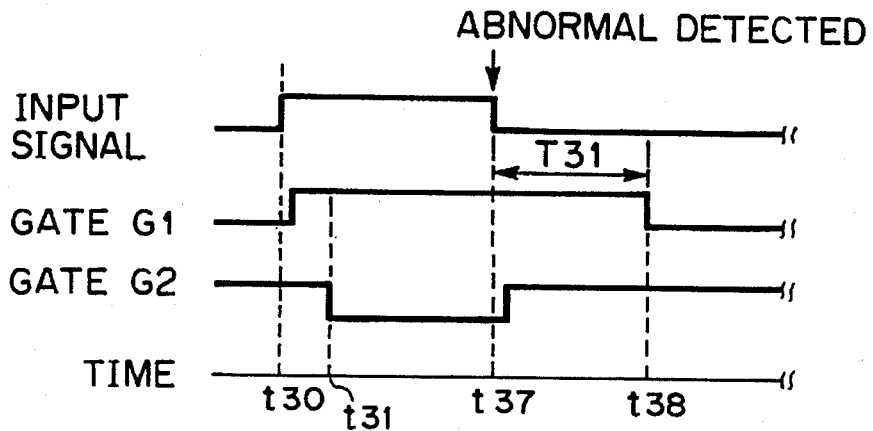
FIG. 35 is a timing chart illustrating changes in gate voltage of the control device of the embodiment 11 when an overcurrent occurs in the thyristor condition.

FIG. 35 is a timing chart illustrating changes in gate voltage when an overcurrent generates in the thyristor condition. It is assumed that at the point t30, the input signal 1 changes to the H level and the second double gate semiconductor device 216 is transferred from the OFF state to the transistor condition, and an overcurrent generates at a point t37 after the transfer to the thyristor condition at a point t31. At this moment, the overcurrent is detected by the passing current detection circuit 262, and an L level turn-off signal is applied to the input terminal P1 and the inverter 277 by the turn-off signal applying circuits 263 and 274. When the input of the inverter 277 changes to the L level, the gate signal, which is reversed three times by the inverter 277, the NOR gate 278, and the reversing inverter 222.1 to be the H level, is applied to the second gate electrode, and the second double gate semiconductor device 216 is transferred from the thyristor condition to the transistor condition. On the other hand, the L level turn-off signal applied to the input terminal P1 by the turn-off signal applying circuit 263 is applied to the first gate electrode at a point t38 delayed by the time T31 by the off-delay path 225 of the first gate electrode control means 221 and, at this moment, the second double gate semiconductor device 216 can be transferred from the transistor condition to the OFF state.

In the control device of the embodiment 11 of the above construction, it is possible to control the first gate electrode and the second gate electrode having operation modes reverse to each other by a single input signal to make ON/OFF control of the second double gate semiconductor device 216, an overcurrent is detected by the abnormality detection and protective means 253, and the second double gate semiconductor device 216 can be safely transferred to the OFF state through the transistor condition even when an overcurrent occurs in either the transistor condition or the thyristor condition.

Embodiment 12

Figure 36:
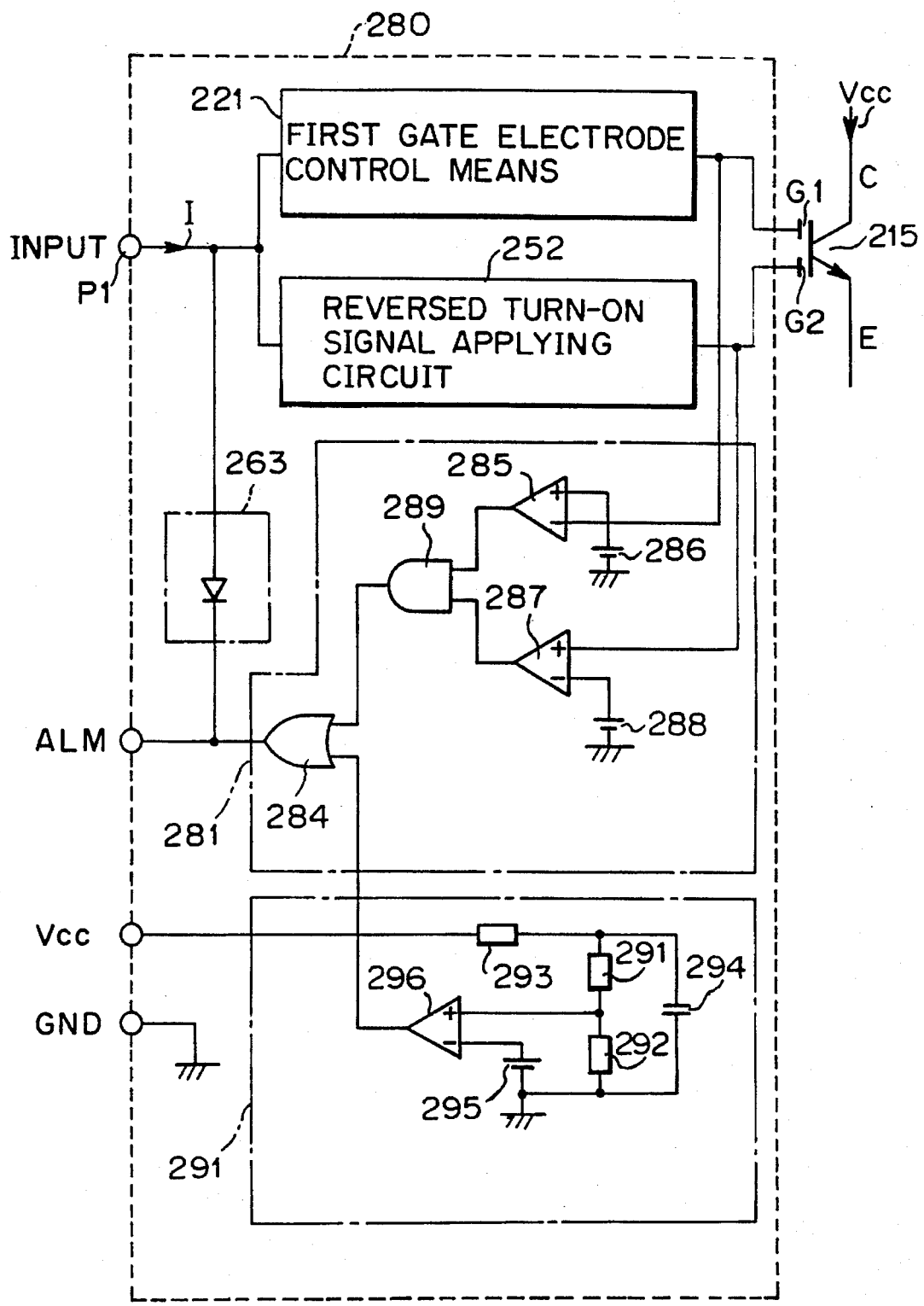
FIG. 36 is a simplified circuit diagram showing a control device for the second double gate semiconductor device according to an embodiment 12 of the present invention.

FIG. 36 is a simplified circuit diagram showing the structure of a control device according to an embodiment 12 of the present invention, in which the first and second gate electrode potentials are both L level at the beginning of application of the operating voltage VCC of the second double gate semiconductor device 215 or when momentary interruption of the operating voltage is eliminated, thereby preventing latch-up of the second double gate semiconductor device 215. Referring to the Figure, a control device 280 includes first gate electrode control means as shown in the embodiment 10 (FIG. 27) of the present invention and a reversed turn-on signal applying circuit 252 of second gate electrode control means 251, and provided further with a constant time operating timer circuit 291 for detecting a rising edge of the operating voltage applied to the collector electrode of the second double gate semiconductor device 215 and operating for a predetermined time, an abnormality notify circuit 281 for monitoring and first gate electrode potential and the second gate electrode potential during operation of the constant time operating timer circuit 291 and outputting a low-potential notify signal when both the gate potentials are low, and a turn-off signal applying circuit 263 for applying a turn-off signal to the first gate electrode control means and the second gate electrode control means in response to the notify signal.

The constant time operating timer circuit 291 is constructed so that the rising edge of the operating voltage VCC is delayed by a constant time by the capacitor 294, the delayed voltage is divided by voltage dividing resistors 291 and 292 and applied to the non-reversed input of the comparator 296 to be compared with the reference voltage of the reference power supply 295, and an H level turn-on signal is outputted when the non-reversed input exceeds the reference voltage. Further, the abnormality notify circuit 281 comprises a comparator 285 for receiving the first gate electrode potential to the non-reversed input side and comparing it with the voltage of a reference power supply 286, a comparator for receiving the second gate electrode potential to the non-reversed input side and comparing it with the voltage of the reference power supply 286, an AND gate 289 disposed at the output side of both the comparators, and an OR gate 284 disposed at the output side of the AND gate 289 and the comparator 296. When the double gate semiconductor device 215 is not in the OFF state where the first gate electrode potential is L and the second gate electrode potential is H during operation of the constant time operating timer circuit 291, the OR gate outputs an L level notify signal. Therefore, when an external device is driven utilizing the notify signal so that the operating voltage VCC is not applied to the second double gate semiconductor device 215, latch-up of the second double gate semiconductor device 215 caused by applying the operating voltage between the collector and the emitter in the condition where both the first and second gate electrode potentials are L level can be prevented, thereby preventing damages to the second double gate semiconductor device 215 due to the latch-up. Further, the notify signal can be detected by the turn-off signal applying circuit 263 to output a turn-off signal to the first gate electrode control means 221 and the reversed turn-on signal applying circuit 252, so that the gate control circuits 221 and 251 do not operated even if an input signal is inputted by mistake.

Figure 37:
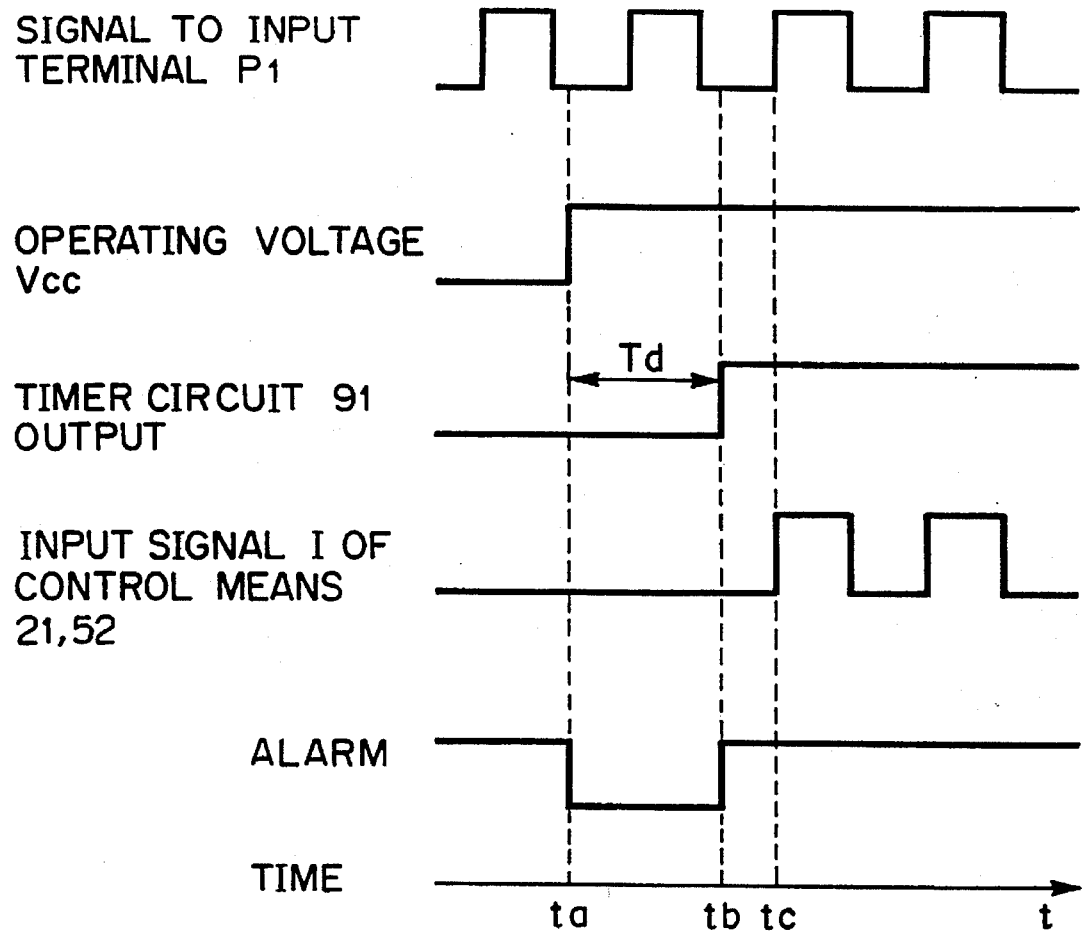
FIG. 37 is a simplified timing chart illustrating the operation of the control device of the embodiment 12 when an abnormality occurs.

FIG. 37 is a simplified timing chart illustrating the operation of a control device according to an embodiment 12 when an abnormality occurs. It is assumed that the operating voltage VCC rises at a point tc under the condition that the input signal I is applied to the input terminal P1 of the control device 280. At this moment, the constant time operating timer circuit 291 outputs a signal, which rises at a point tb after making a delay operation for a constant time (Td), to the OR gate 284. On the other hand, the abnormality notify circuit 281 monitors whether or not the first and second gate electrode potentials are in the OFF state during a time t, for example, when both are L level, the output side of the OR gate goes to the L level to output an L level notify signal for a time Td. Further, the turn-off signal applying circuit 263 detects the notify signal to output a turn-off signal to the first gate electrode control means 221 and the reversed turn-on signal applying circuit 252 to interrupt the operation of the circuit until the time tb at which the L level notify signal tb. Therefore, by blocking the application of the operating voltage to the second double gate semiconductor device 215 by the time tb utilizing the notify signal, damages to the second double gate semiconductor device 215 can be prevented.

As described above, the present invention has the second gate electrode capable of controlling the transition to the thyristor condition and the transistor condition, and the first gate electrode capable of controlling the transition from the transistor condition to the thyristor condition, wherein the control device for controlling the second double gate semiconductor device having voltage application modes of both gate electrodes reverse to each other comprises the first gate electrode control means for delaying the turn-on signal of the input signal and supplying the signal to the first gate electrode, and the second gate electrode control means for reversing the polarity of the input signal and applying the signal to the second gate electrode. As a result, it is possible to apply ON/OFF signals having voltage application modes reverse to each other by the two gate electrodes by a single input signal, extend the duration time of the voltage applied to the first gate electrode to the wave end, so that the second double gate semiconductor device makes the OFF operation always through the transistor condition, thereby providing a control device which can stably make ON/OFF control of the second double gate semiconductor device having a pair of gate electrodes having voltage application modes reverse to each other by a single input signal.

Further, by an improvement such as providing a delay circuit or an abnormality detection and protective circuit for an overcurrent or a notify circuit to the second gate electrode control means, a double gate semiconductor device provided with a reliable control device with improved abnormality detection function and protective function can be provided.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A control device for controlling a double gate semiconductor device having a second gate electrode for controlling the transition from a thyristor operation to a transistor operation, and a first gate electrode for controlling the transition from the transistor operation to an ON/OFF operation, and for controlling a passing current from a collector electrode to an emitter electrode, comprising;

first gate control means for delaying a turn-off signal to said double gate semiconductor device and applying the turn-off signal to said first gate electrode.

2. The control device for controlling a double gate semiconductor device as claimed in claim 1, wherein said first gate control means is timer delay means for delaying a turn-off signal for a predetermined time and applying the turn-off signal to said first gate electrode.

3. The control device for controlling a double gate semiconductor device as claimed in claim 1, wherein:

said first gate control means comprises operation determination delay means, which includes:

an operation determination circuit part, coupled to said collector electrode, for determining an operating voltage applied to said collector electrode and outputting a signal indicative thereof, and a turn-off signal application circuit part, coupled to receive the signal from said operation determination circuit part and to output the turn-off signal to said first gate electrode, for applying the turn-off signal to said first gate electrode depending on the signal from said operation determination circuit part.

4. A control device for controlling a double gate semiconductor device having a second gate electrode for controlling the transition from a thyristor operation to a transistor operation, and a first gate electrode for controlling the transition from the transistor operation to an ON/OFF operation, and for controlling a passing current from a collector electrode to an emitter electrode, comprising;

second gate control means, coupled to said second gate electrode, for delaying a turn-on signal to said double gate semiconductor device and applying the turn-on signal to said second gate electrode.

5. The control device for controlling a double gate semiconductor device as claimed in claim 4, wherein:

said second gate control means comprises an abnormality detection delay means, which includes:

a current determination circuit part, coupled to the double gate semiconductor device, for determining the value of the passing current passing through the double gate semiconductor device from collector electrode to emitter electrode, a turn-on signal application circuit part, coupled to receive a determination result from the current determination circuit part and coupled to said second gate electrode, for applying the turn-on signal to said second gate electrode according to a determination result of said current determination circuit part, and a turn-off signal application circuit part, coupled to receive the determination result from the current determination circuit part and coupled to said first gate electrode, for applying a turn-off signal to said first gate electrode according to a determination result of said current determination circuit part.

6. The control device for controlling a double gate semiconductor device as claimed in claim 5, wherein:

said current determination circuit part is a voltage determination circuit part for determining an operating voltage applied to said collector electrode.

7. A control device for controlling a double gate semiconductor device having a second gate electrode for controlling the transition from a thyristor operation to a transistor operation, and a first gate electrode for controlling the transition from the transistor operation to an ON/OFF operation, and for controlling a passing current from a collector electrode to an emitter electrode, comprising;

passing current determination means, coupled to the double gate semiconductor device, for determining the passing current, and turn-off signal output means, coupled to the double gate semiconductor device and to said passing current determination means, for outputting a turn-off signal according to a determination result of said passing current determination means.

8. A control device for controlling a double gate semiconductor device having a second gate electrode for controlling the transition from a thyristor operation to a transistor operation, and a first gate electrode for controlling the transition from the transistor operation to an ON/OFF operation, and for controlling a passing current from a collector electrode to an emitter electrode, comprising:

first gate control means, coupled to said first gate electrode, for delaying a turn-off signal to said double gate semiconductor device and applying the turn-off signal to said first gate electrode, and second gate control means, coupled to said second gate electrode, for delaying a turn-on signal to said double gate semiconductor device and applying the turn-on signal to said second gate electrode, wherein:

said second gate control means comprises abnormality detection delay means, which includes:

a current determination circuit part, coupled to the double gate semiconductor device, for determining the value of the passing current passing through the double gate semiconductor device from collector electrode to emitter electrode, a turn-on signal application circuit part, coupled to receive a determination result from the current determination circuit part and coupled to said second gate electrode, for applying the turn-on signal to said second gate electrode according to a determination result of said current determination circuit part, and a turn-off signal application circuit part, coupled to receive the determination result from the current determination circuit part and coupled to said first gate control means, for applying a turn-off signal to said first gate control means according to a determination result of said current determination circuit part.

9. The control device for controlling a double gate semiconductor device as claimed in claim 8, wherein:

said current determination circuit part is a voltage determination circuit part for determining an operating voltage applied to said collector electrode.

10. The control device for controlling a double gate semiconductor device as claimed in claim 8, wherein:

said first gate control means is timer delay means for delaying the turn-off signal for a predetermined time and applying the turn-off signal to said first gate, said timer delay means comprising first and second time constant determination parts connected in series, and the turn-off signal from said turn-off signal application circuit part is applied to said second time constant determination part.

11. The control device for controlling a double gate semiconductor device as claimed in claim 10, wherein:

said first time constant-determination part is first impedance means, and said second time constant determination part is second impedance means.

12. The control device for controlling a double gate semiconductor device as claimed in claim 10, wherein:

said first time constant determination part is a first capacitor, and said second time constant determination part is a second capacitor.

13. The control device for controlling a double gate semiconductor device as claimed in claim 8, wherein said turn-off signal application circuit part comprises:

rectification means for passing a current only in a direction from said second gate electrode to said first gate electrode.

14. The control device for controlling a double gate semiconductor device as claimed claim 13, wherein:

said first gate electrode, said second electrode, and said rectification means comprise polycrystalline silicon formed on the surface of said double gate semiconductor device.

15. The control device of controlling a double gate semiconductor device as claimed claim 14, wherein:

said first gate electrode is of an n- type, said second gate electrode is of a p- type, said rectification means has a pn junction, the n- type portion of said rectification means is connected to said first gage electrode, and the p- type portion of said rectification means is connected to said second gate electrode.

16. The control device for controlling a double gate semiconductor device as claimed in claim 14, wherein:

said rectification means has a pn junction, the n- type portion of said rectification means is connected to said first gate electrode with an aluminum deposition wiring, and the p- type portion of said rectification means is connected to said second gate electrode with an aluminum deposition wiring.

17. A control device for a double gate semiconductor device having a second gate electrode for controlling transition to a thyristor condition and a transistor condition, and a first gate electrode for controlling transition from the transistor condition to an ON/OFF operation, for controlling said first gate electrode and said second gate electrode of said double gate semiconductor device having voltage application modes to both said gate electrodes reverse to each other according to a single input signal, comprising:

first gate electrode control means, coupled to said first gate electrode, for delaying a turn-off signal of the input signal and supplying the delayed turn-off signal to said first gate electrode; and second gate electrode control means, coupled to said second gate electrode, for reversing the polarity of the input signal and supplying the reversed signal to said second gate electrode.

18. The control device for a double gate semiconductor device as claimed in claim 17, wherein:

said first gate control means has timer delay means for delaying a turn-off signal of the input signal for a predetermined time and applying the signal to said first gate electrode, and said second gate electrode control means has a reversing inverter for reversing the polarity of the input signal and an even number of waveform shaping inverters connected in series to said reversing inverter.

19. The control device for a double gate semiconductor device as claimed in claim 17, wherein:

said first gate control means has operation determination delaying means comprising:

an operation determination circuit, coupled to a collector electrode of said double gate semiconductor device, for determining an operating voltage applied to the collector electrode of said double gate semiconductor device, and a turn-off signal applying circuit, coupled to said operation determination circuit and said first gate electrode, for applying a turn-off signal to said first gate electrode according to the determination result of said operation determination circuit, and said second gate electrode control means comprises a reversing inverter for reversing the polarity of the input signal and an even number of waveform shaping inverters connected in series to said reversing inverter.

20. A control device for a double gate semiconductor device having a second gate electrode for controlling transition to a thyristor condition and a transistor condition, and a first gate electrode for controlling transition from the transistor condition to an ON/OFF operation, for controlling said first gate electrode and said second gate electrode of said double gate semiconductor device having voltage application modes to both said gate electrodes reverse to each other according to a single input signal, comprising:

first gate electrode control means, coupled to said first gate electrode, having timer delay means for delaying a turn-off signal of an input signal for a predetermined period of time and applying the turn-off signal to the first gate electrode;

second gate electrode control means, coupled to said second gate electrode, comprising reversing inverter means for reversing the polarity of the input signal and an even number of waveform shaping inverters connected in series to said reversing inverter; and abnormality detection and protective means comprising a passing current determination circuit, coupled to the double gate semiconductor device, for determining an abnormality of a passing current value of said double gate semiconductor device, and a turn-off signal applying circuit, coupled to said first gate electrode and said passing current determination circuit, for applying a turn-off signal to said first gate electrode control means in response to the abnormality determination result of said passing current determination circuit.

21. A control device for a double gate semiconductor device having a passing current value, a second gate electrode for controlling transition to a thyristor condition and a transistor condition, and a first gate electrode for controlling transition from the transistor condition to an ON/OFF operation, for controlling said first gate electrode and said second gate electrode of said double gate semiconductor device having voltage application modes to both said gate electrodes reverse to each other according to a single input signal, comprising:

first gate electrode control means, coupled to said first gate electrode, for delaying a turn-off signal of the input signal and supplying the signal to said first gate electrode; and second gate electrode control means, coupled to said second gate electrode, for delaying the input signal, reversing the potential of the input signal in response to an abnormality of the passing current value, and applying the potential of the input signal to said second gate electrode.

22. The control device for a double gate semiconductor device as claimed in claim 21, wherein said second gate electrode control means comprises a current determination circuit for determining the abnormality of the passing current value of said double gate semiconductor device;

a reversed turn-on signal applying circuit, coupled to said current determination circuit and said second gate electrode, for outputting a turn-on signal delayed in response to the determination result of said current determination circuit, reversing the delayed turn-on signal and applying the turn-on signal to said second gate electrode; and a turn-off signal applying circuit, coupled to said current determination circuit and said first gate electrode, for applying a turn-off signal to said first gate electrode according to the abnormality determination result of said current determination circuit.

23. The control device for a double gate semiconductor device as claimed in claim 22, wherein:

said double gate semiconductor device is a sense double gate semiconductor device having a sense terminal, and said current determination circuit for determining an abnormality of the passing current is connected to said sense terminal.

24. The control device for a double gate semiconductor device as claimed in claim 22, wherein:

said current determination circuit of said second gate electrode control means is a voltage determination circuit for determining an abnormality of the operating voltage applied to a collector electrode of said double gate semiconductor device.

25. The control device for a double gate semiconductor device as claimed in claim 21, wherein:

said second gate electrode control means includes abnormality detection means comprising:

a passing current determination circuit for determining an abnormality of the passing current value, a turn-on signal applying circuit, coupled to said passing current determination circuit and said second gate electrode, for applying a turn-on signal delayed according to the abnormality determination result of said passing current determination circuit to said second gate electrode through a reversing inverter, and a turn-off signal applying circuit, coupled to said passing current determination circuit and said first gate electrode, for applying a turn-off signal to said first gate electrode according to the abnormality determination result of said passing current determination circuit.

26. A control device for a double gate semiconductor device having a second gate electrode for controlling transition to a thyristor condition and a transistor condition, and a first gate electrode for controlling transition from the transistor condition to an ON/OFF operation, for controlling said first gate electrode and said second gate electrode of said double gate semiconductor device having voltage application modes to both said gate electrodes reverse to each other according to a single input signal, comprising:

first gate electrode control means, coupled to said first gate electrode, having timer delay means for delaying a turn-off signal of an input signal for a predetermined period of time and applying the turn-off signal to said first gate electrode;

second gate electrode control means, coupled to said second gate electrode, having timer delay means for delaying a turn-on signal of the input signal for a predetermined period of time and a reversing inverter for converting the delayed turn-on signal to a turn-off signal and supplying the turn-off signal to said second gate electrode;

and abnormality detection and protective means, coupled to said double gate semiconductor device, said first gate electrode control means and said second gate electrode control means, comprising:

a timer circuit, coupled to a collector electrode of said double gate semiconductor device, for detecting a rising edge of an operating voltage applied to the collector electrode of said double gate semiconductor device to operate for a predetermined time, an abnormality notify circuit, coupled to said first and said second gate electrodes, for monitoring the first gate electrode potential and the second gate electrode potential during operation of said timer circuit and giving a low-potential notify signal when both said gate electrode potentials are low, and a turn-off signal applying circuit, coupled to said first gate electrode and said abnormality notify circuit, for applying a turn-off signal to said first gate electrode control means and said second gate electrode control means in response to the notify signal.

* * * * *